US012635447B2

(12) United States Patent
Akiyama et al.

(10) Patent No.: US 12,635,447 B2
(45) Date of Patent: May 19, 2026

(54) SUBSTRATE TREATMENT METHOD AND SUBSTRATE TREATMENT DEVICE

(71) Applicant: SCREEN Holdings Co., Ltd., Kyoto (JP)

(72) Inventors: Katsuya Akiyama, Kyoto (JP); Yukifumi Yoshida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 133 days.

(21) Appl. No.: 18/549,882

(22) PCT Filed: Oct. 21, 2021

(86) PCT No.: PCT/JP2021/038940
§ 371 (c)(1),
(2) Date: Sep. 8, 2023

(87) PCT Pub. No.: WO2022/190451
PCT Pub. Date: Sep. 15, 2022

(65) Prior Publication Data
US 2024/0178012 A1 May 30, 2024

(30) Foreign Application Priority Data
Mar. 11, 2021 (JP) ................................ 2021-039289

(51) Int. Cl.
*H10P 70/00* (2026.01)
*B08B 7/00* (2006.01)
*H10P 72/00* (2026.01)

(52) U.S. Cl.
CPC ........ *H10P 72/0414* (2026.01); *B08B 7/0014* (2013.01); *H10P 70/00* (2026.01); *H10P 70/15* (2026.01); *H10P 72/0424* (2026.01)

(58) Field of Classification Search
None
See application file for complete search history.

(56) References Cited

U.S. PATENT DOCUMENTS

2001/0004066 A1* 6/2001 Toshima ........... H01L 21/02063 257/E21.255
2006/0266382 A1 11/2006 Matsubara ...................... 134/33
(Continued)

FOREIGN PATENT DOCUMENTS

CN 107437517 A 12/2017
JP 2006-332396 A 12/2006
(Continued)

OTHER PUBLICATIONS

Merriam-Webster Dictionary definition of "among".*
(Continued)

*Primary Examiner* — Kaj K Olsen
*Assistant Examiner* — Ryan L Coleman
(74) *Attorney, Agent, or Firm* — OSTROLENK FABER LLP

(57) ABSTRACT

A substrate processing method includes a hydrophilic film forming liquid supplying step of supplying, toward a major surface of a substrate, a hydrophilic film forming liquid to form a hydrophilic film on the major surface, a film thickness reducing liquid supplying step of supplying, toward the major surface, a film thickness reducing liquid to reduce a thickness of the hydrophilic film, a processing film forming liquid supplying step of supplying, toward the major after the thickness of the hydrophilic film has been reduced, a processing film forming liquid to form, on a front surface of the hydrophilic film, a processing film that holds a removal object present on the major surface, and a peeling liquid supplying step of supplying, toward the major surface, a peeling liquid to peel off the processing film from the hydrophilic film.

11 Claims, 13 Drawing Sheets

(56) References Cited

U.S. PATENT DOCUMENTS

| | | | | |
|---|---|---|---|---|
| 2008/0051010 | A1* | 2/2008 | Uemura | H01L 21/02024 451/36 |
| 2014/0315373 | A1* | 10/2014 | Okita | H01L 21/02041 438/478 |
| 2015/0056399 | A1* | 2/2015 | Takeoka | B29C 67/202 525/190 |
| 2015/0128994 | A1* | 5/2015 | Kaneko | H01L 21/67051 134/4 |
| 2016/0035561 | A1 | 2/2016 | Aibara et al. | |
| 2017/0345685 | A1 | 11/2017 | Sekiguchi et al. | |
| 2019/0390320 | A1* | 12/2019 | Sasaki | H01L 21/02057 |
| 2021/0063885 | A1* | 3/2021 | Kai | H01L 21/67051 |

FOREIGN PATENT DOCUMENTS

| | | | |
|---|---|---|---|
| KR | 10-2016-0016667 | A | 2/2016 |
| TW | 202028450 | A | 8/2020 |

OTHER PUBLICATIONS

International Preliminary Report on Patentability (Chapter I) mailed Sep. 21, 2023 with Notification from the International Bureau (Form PCT/IB/326) in corresponding PCT International Application No. PCT/JP2021/038940 in Japanese.

English translation of the International Preliminary Report on Patentability (Chapter I) mailed Sep. 21, 2023 with Notification from the International Bureau (Form PCT/IB/338) in corresponding PCT International Application No. PCT/JP2021/038940 with Notification from the International Bureau (Form PCT/IB/338).

* cited by examiner

FIG. 8

| Hydrophilic component | Processing film peeling performance | | | |
|---|---|---|---|---|
| | Si substrate | | a-C substrate | SiCN substrate |
| | Hydrophilic | Hydrophobic | | |
| Sample UL1 | OK | OK | OK | OK |
| Sample UL2 | OK | OK | OK | OK |
| Sample UL3 | OK | OK | OK | OK |
| Sample UL4 | OK | – | NG | OK |
| Sample UL5 | OK | – | OK | NG |

FIG. 9

| Hydrophilic component | Particle removal efficiency |
|---|---|
| Sample UL1 | 82% |
| Sample UL2 | 94% |
| Sample UL3 | 99% |
| Sample UL4 | 98% |
| Sample UL5 | 99% |
| Without hydrophilic film | 0% |

SUBSTRATE TREATMENT METHOD AND SUBSTRATE TREATMENT DEVICE

CROSS-REFERENCE TO RELATED APPLICATIONS

The present application is a 35 U.S.C. §§ 371 national stage application of International Application No. PCT/JP2021/038940 filed Oct. 21, 2021, which claims priority to Japanese Patent Application No. 2021-039289, filed Mar. 11, 2021, the contents of which are incorporated herein by reference.

TECHNICAL FIELD

The present invention relates to a substrate processing method for processing substrates and a substrate processing apparatus for processing substrates.

Examples of substrates to be processed include semiconductor wafers, substrates for flat panel displays (FPDs) such as liquid crystal displays, organic electroluminescence (EL) displays, etc., substrates for optical disks, substrates for magnetic disks, substrates for magneto-optical disks, substrates for photomasks, ceramic substrates, substrates for solar cells, and the like.

BACKGROUND ART

Patent Literature 1 indicated below discloses a substrate processing in which a processing film is formed by solidifying or hardening a processing liquid that is supplied to a principal or major surface and the processing film is peeled off from the major surface of the substrate with a peeling liquid to remove a removal object together with the processing film.

CITATION LIST

Patent Literature

Patent Literature 1: United States Patent Application Publication No. 2019/366394

SUMMARY OF INVENTION

Technical Problem

A first component and a second component (polymer) that is lower in solubility in the peeling liquid than the first component are contained in the processing film of Patent Literature 1. If the major surface of the substrate is a hydrophobic surface, entry of the peeling liquid between the substrate and the processing film may be impeded by interaction of the hydrophobic surface and a hydrophobic group of the polymer contained in the processing film. Under such circumstance, it may not be possible to peel off the processing film satisfactorily from the substrate and remove the removal object sufficiently from the major surface of the substrate.

An object of the present invention is thus to provide a substrate processing method and a substrate processing apparatus by which a removal object can be removed satisfactorily from a major surface of a substrate regardless of the state of the major surface of the substrate.

Solution to Problem

A preferred embodiment of the present invention provides a substrate processing method including a hydrophilic film forming liquid supplying step of supplying, toward a major surface of a substrate, a hydrophilic film forming liquid to form a hydrophilic film on the major surface of the substrate, a film thickness reducing liquid supplying step of supplying, toward the major surface of the substrate, a film thickness reducing liquid that dissolves the hydrophilic film to reduce a thickness of the hydrophilic film, a processing film forming liquid supplying step of supplying, toward the major surface of the substrate after the thickness of the hydrophilic film has been reduced by the film thickness reducing liquid supplying step, a processing film forming liquid to form, on a front surface of the hydrophilic film, a processing film that holds a removal object present on the major surface of the substrate, and a peeling liquid supplying step of supplying, toward the major surface of the substrate, a peeling liquid to peel off the processing film from the hydrophilic film.

According to the present substrate processing method, the hydrophilic film can be formed on the major surface of the substrate by supplying the hydrophilic film forming liquid toward the major surface of the substrate. In a state where the hydrophilic film is formed on the major surface of the substrate, the film thickness of the hydrophilic film on the major surface of the substrate can be reduced by supplying the film thickness reducing liquid toward the major surface of the substrate and dissolving the hydrophilic film in the film thickness reducing liquid. By supplying the processing film forming liquid toward the major surface of the substrate after the thickness of the hydrophilic film has been reduced, the processing film can be formed on the front surface of the hydrophilic film that has been reduced in thickness. By supplying the peeling liquid toward the major surface of the substrate in a state where the processing film is formed on the front surface of the hydrophilic film, the processing film can be peeled off from the hydrophilic film. The peeling liquid may be an alkaline liquid.

Even if the major surface of the substrate is a hydrophobic surface, it is possible to falsely hydrophilize the major surface of the substrate by forming the hydrophilic film on the major surface of the substrate. Strictly speaking, properties of the major surface of the substrate are not changed per se. Increasing of hydrophilicity of a portion forming a contact interface with the processing film by interposing the hydrophilic film between the processing film and the major surface of the substrate is expressed as "falsely hydrophilizing the major surface of the substrate." The hydrophobic surface is a surface on which, for example, one type among amorphous carbon, silicon carbide, and ruthenium or a plurality of types among these is or are exposed.

By falsely hydrophilizing the major surface of the substrate by forming the hydrophilic film, it is made easy for the peeling liquid to enter between the major surface of the substrate and the processing film, or in detail, into the contact interface between the processing film and the hydrophilic film. The processing film in a state of holding the removal object present on the major surface of the substrate can thus be peeled off satisfactorily from the major surface of the substrate.

With the present substrate processing method, the thickness of the hydrophilic film is reduced by the film thickness reducing liquid before the processing film is peeled off from the hydrophilic film. The removal object present on the major surface of the substrate can thus be exposed satisfactorily from the hydrophilic film. Therefore, by forming the processing film on the front surface of the hydrophilic film that has been reduced in thickness, the removal object can be held firmly by the processing film. The removal object can thus be removed satisfactorily together with the processing film by subsequent supply of the peeling liquid.

Thus, even if the major surface of the substrate is a hydrophobic surface, that is, regardless of the state of the major surface of the substrate, the removal object can be removed satisfactorily from the major surface of the substrate. The film thickness reducing liquid may be water. The film thickness reducing liquid is preferably a liquid that is the same as a solvent contained in the hydrophilic film forming liquid.

In a preferred embodiment of the present invention, the substrate processing method further includes a hydrophilic film removing liquid supplying step of supplying, toward the major surface of the substrate after the peeling liquid supplying step, a hydrophilic film removing liquid to remove the hydrophilic film from the major surface of the substrate.

According to the present substrate processing method, the hydrophilic film can be removed from the major surface of the substrate by the hydrophilic film removing liquid after removing the removal object from the major surface of the substrate by peeling off the processing film by the peeling liquid. Therefore, after removing the removal object, the major surface of the substrate can be returned to the state before the hydrophilic film is formed. The hydrophilic film removing liquid may be an acidic liquid.

In a preferred embodiment of the present invention, the hydrophilic film forming liquid contains a hydrophilic component having hydrophobic groups and hydrophilic groups and having more hydrophilic groups than hydrophobic groups.

According to the present substrate processing method, the hydrophilic component contained in the hydrophilic film forming liquid has both hydrophobic groups and hydrophilic groups. Since the hydrophilic component has more hydrophilic groups than hydrophobic groups, a surface that is sufficiently high in hydrophilicity (the front surface of the hydrophilic film) can be exposed regardless of whether or not the major surface of the substrate is a hydrophobic surface. Further, since the hydrophilic component has the hydrophobic groups, when the major surface of the substrate is a hydrophobic surface, an interaction can be made to act between the hydrophobic group and the hydrophobic surface. The hydrophilic component is, for example, a nitrogen-containing polymer, a nitrogen-containing compound, or a saturated nitrogen-containing hydrocarbon ring, or a salt of any of these.

In a preferred embodiment of the present invention, the processing film forming liquid contains a high solubility component and a low solubility component that is less soluble in the peeling liquid than the high solubility component.

Therefore, by supplying the peeling liquid toward the major surface of the substrate, the high solubility component in the processing film can be selectively dissolved in the peeling liquid. The peeling liquid moves toward the contact interface between the processing film and the hydrophilic film while selectively dissolving the high solubility component. The peeling liquid can thus form a path inside the processing film. After the path has been formed by dissolution of the high solubility component, the peeling liquid reaches the contact interface between the processing film and the hydrophilic film efficiently via the path. The peeling liquid can thereby be made to act effectively on the contact interface between the processing film and the hydrophilic film.

While the high solubility component is dissolved, a large portion of the low solubility component is not dissolved by the peeling liquid. The processing film can thus be split into comparatively large film pieces and the removal object can be held by a film piece that is mainly constituted of the low solubility component. Consequently, the processing film can be peeled off quickly from the major surface of the substrate and the removal object, together with the processing film, can be washed away efficiently to an exterior of the major surface of the substrate by a flow of the peeling liquid.

Here, that the "high solubility component is selectively dissolved" does not mean that just the high solubility component is dissolved but means that although the low solubility component may be also dissolved slightly, a large portion of the high solubility component is dissolved.

The low solubility component may include at least one among novolacs, polyhydroxystyrenes, polystyrenes, polyacrylic acid derivatives, polymaleic acid derivatives, polycarbonates, polyvinyl alcohol derivatives, polymethacrylic acid derivatives, and copolymers that are combinations of these.

Also, the high solubility component may be a crack promoting component and the crack promoting component may contain a hydrocarbon and a hydroxy group and/or carbonyl group.

The high solubility component may be a substance that is represented by at least one among (B-1), (B-2), and (B-3) indicated below.

(B-1) is a compound that contains 1-6 of chemical formula 1 as a constituent unit and with which each constituent unit is bonded by a linking group $L_1$.

[Chemical Formula 1]

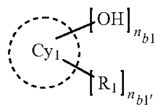

Here, $L_1$ is selected from at least among a single bond and $C_{1-6}$ alkylenes, $Cy_1$ is a hydrocarbon ring of $C_{5-30}$, $R_1$ is each independently an alkyl of $C_{1-5}$, $n_{b1}$ is 1, 2, or 3, and $n_{b1'}$ is 0, 1, 2, 3, or 4.

(B-2) is a compound that is represented by chemical formula 2.

[Chemical Formula 2]

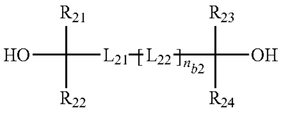

Here, $R_{21}$, $R_{22}$, $R_{23}$, and $R_{24}$ are each independently hydrogen or an alkyl of $C_{1-5}$, $L_{21}$ and $L_{22}$ are each independently an alkylene of $C_{1-20}$, a cycloalkylene of $C_{1-20}$, an alkenylene of $C_{2-4}$, an alkynylene of $C_{2-4}$, or an arylene of $C_{6-20}$, these groups may be substituted with an alkyl of $C_{1-5}$ or hydroxy, and $n_{b2}$ is 0, 1, or 2.

(B-3) is a polymer that contains constituent units represented by chemical formula 3 and has a weight average molecular weight (Mw) of 500~10,000.

[Chemical Formula 3]

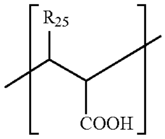

$R_{25}$ is —H, —$CH_3$, or —COOH.

In a preferred embodiment of the present invention, in the film thickness reducing liquid supplying step, the hydrophilic film is dissolved in the film thickness reducing liquid such that the thickness of the hydrophilic film becomes smaller than a particle diameter of the removal object.

The removal object can thus be exposed even more satisfactorily from the front surface of the hydrophilic film. The processing film can thus be made to hold the removal object even more firmly. The removal object can thus be removed satisfactorily together with the processing film by the subsequent supply of the peeling liquid. The particle diameter of the removal object is a conventional value corresponding to the diameter of a perfect sphere based on the assumption that the removal object is such.

Another preferred embodiment of the present invention provides a substrate processing method including a hydrophilic film forming liquid supplying step of supplying, toward a major surface of a substrate, a hydrophilic film forming liquid to form hydrophilic film on the major surface of the substrate, that the hydrophilic film forming liquid containing a hydrophilic component having hydrophobic groups and hydrophilic groups and having more hydrophilic groups than hydrophobic groups, a processing film forming liquid supplying step of supplying, toward the major surface of the substrate, a processing film forming liquid to form, on a front surface of the hydrophilic film, a processing film that holds a removal object present on the major surface of the substrate, and a peeling liquid supplying step of supplying, toward the major surface of the substrate, a peeling liquid to peel off the processing film from the hydrophilic film.

According to the present substrate processing method, the hydrophilic film can be formed on the major surface of the substrate by supplying the hydrophilic film forming liquid toward the major surface of the substrate. By supplying the processing film forming liquid toward the major surface of the substrate in a state where the hydrophilic film is formed on the major surface of the substrate, the processing film can be formed on the front surface of the hydrophilic film. By supplying the peeling liquid toward the major surface of the substrate in a state where the processing film is formed on the front surface of the hydrophilic film, the processing film can be peeled off from the hydrophilic film. The peeling liquid may be an alkaline liquid.

Even if the major surface of the substrate is a hydrophobic surface, it is possible to falsely hydrophilize the major surface of the substrate by forming the hydrophilic film on the major surface of the substrate. The hydrophobic surface is a surface on which, for example, one type among amorphous carbon, silicon carbide, and ruthenium or a plurality of types among these is or are exposed.

According to the present substrate processing method, the hydrophilic component contained in the hydrophilic film forming liquid has both hydrophobic groups and hydrophilic groups. Since the hydrophilic component has more hydrophilic groups than hydrophobic groups, a surface that is sufficiently high in hydrophilicity (the front surface of the hydrophilic film) can be exposed regardless of whether or not the major surface of the substrate is a hydrophobic surface.

By hydrophilizing the major surface of the substrate by forming the hydrophilic film, it is made easy for the peeling liquid to enter between the major surface of the substrate and the processing film, or in detail, into a contact interface between the processing film and the hydrophilic film. The processing film in a state of holding the removal object present on the major surface of the substrate can thus be peeled off satisfactorily from the major surface of the substrate.

Consequently, the removal object can be removed satisfactorily from the major surface of the substrate even if the major surface of the substrate is a hydrophobic surface.

In another preferred embodiment of the present invention, the processing film forming liquid contains a hydrophobic component that is lower in hydrophilicity than the hydrophilic component. With a method in which, unlike in the present substrate processing method, a processing film is formed on a major surface of a substrate without forming a hydrophilic film, if the major surface of the substrate is a hydrophobic surface, a hydrophobic interaction occurs between a hydrophobic component in the processing film and the major surface of the substrate. On the other hand, with the present substrate processing method, the processing film is formed on the front surface of the hydrophilic film. That is, the hydrophilic film is formed between the processing film and the major surface of the substrate. Therefore, a hydrophobic interaction between the processing film and the major surface of the substrate can be suppressed. Since the peeling liquid can thus be made to act satisfactorily on the interface between the processing film and the hydrophilic film, the processing film can be peeled off satisfactorily.

In a preferred embodiment of the present invention, the processing film forming liquid contains a high solubility component that is more soluble in the peeling liquid than the hydrophobic component.

Therefore, by supplying the peeling liquid toward the major surface of the substrate, the high solubility component in the processing film can be selectively dissolved in the peeling liquid. The peeling liquid moves toward the contact interface between the processing film and the hydrophilic film while selectively dissolving the high solubility component. The peeling liquid can thus form a path inside the processing film. After the path has been formed by dissolution of the high solubility component, the peeling liquid reaches the contact interface between the processing film and the hydrophilic film efficiently via the path. The peeling liquid can thereby be made to act effectively on the contact interface between the processing film and the hydrophilic film.

While the high solubility component is dissolved, a large portion of the hydrophobic component is not dissolved by the peeling liquid. The processing film can thus be split into comparatively large film pieces and the removal object can be held by a film piece that is mainly constituted of the hydrophobic component. Consequently, the processing film can be peeled off quickly from the major surface of the substrate and together with the processing film, the removal object can be washed away efficiently to an exterior of the major surface of the substrate by a flow of the peeling liquid.

Here, that the "high solubility component is selectively dissolved" does not mean that just the high solubility component is dissolved but means that although the hydrophobic component may also be dissolved slightly, a large portion of the high solubility component is dissolved. As the hydrophobic component, the same component as the low solubility component described above may be used.

In another preferred embodiment of the present invention, an affinity of the peeling liquid with respect to a contact interface between the hydrophilic film and the processing film is higher than an affinity of the peeling liquid with respect to a contact interface between the substrate and the hydrophilic film. The processing film can thus be peeled off from the hydrophilic film by the peeling liquid while suppressing peeling off of the hydrophilic film from the major surface of the substrate and maintaining the hydrophilic film on the major surface of the substrate.

In another preferred embodiment of the present invention, the substrate processing method further includes a hydrophilic film removing step of supplying, toward the major surface of the substrate after the peeling liquid supplying step, a hydrophilic film removing liquid to remove the hydrophilic film from the major surface of the substrate.

According to the present substrate processing method, the hydrophilic film can be removed from the major surface of the substrate by the hydrophilic film removing liquid after removing the removal object from the major surface of the substrate by peeling off the processing film by the peeling liquid. Therefore, after removing the removal object, the major surface of the substrate can be returned to the state before the hydrophilic film is formed. The hydrophilic film removing liquid may be an acidic liquid.

Yet another preferred embodiment of the present invention provides a substrate processing apparatus including a hydrophilic film forming liquid supplying member that supplies, toward a major surface of a substrate, a hydrophilic film forming liquid to form a hydrophilic film, a film thickness reducing liquid supplying member that supplies, toward the major surface of the substrate, a film thickness reducing liquid dissolving the hydrophilic film to reduce a thickness of the hydrophilic film, a processing film forming liquid supplying member that supplies, toward the major surface of the substrate, a processing film forming liquid to form a processing film, and a peeling liquid supplying member that supplies, toward the major surface of the substrate, a peeling liquid to peel off the processing film from the hydrophilic film. According to the present substrate processing apparatus, the same effects as the substrate processing method described above are exhibited.

Yet another preferred embodiment of the present invention provides a substrate processing apparatus including a hydrophilic film forming liquid supplying member that supplies, toward a major surface of a substrate, a hydrophilic film forming liquid to form a hydrophilic film on the major surface of the substrate, the hydrophilic film forming liquid containing a hydrophilic component that has hydrophobic groups and hydrophilic groups and has more hydrophilic groups than hydrophobic groups, a processing film forming liquid supplying member that supplies, toward the major surface of the substrate, a processing film forming liquid to form, on a front surface of the hydrophilic film, a processing film that holds a removal object present on the major surface of the substrate, and a peeling liquid supplying member that supplies, toward the major surface of the substrate, a peeling liquid to peel off the processing film from the hydrophilic film. According to the present substrate processing apparatus, the same effects as the substrate processing method described above are exhibited.

The above and yet other objects, features, and effects of the present invention will become apparent from the following description of the preferred embodiments made with reference to the attached drawings.

BRIEF DESCRIPTION OF DRAWINGS

FIG. 8 is a table showing results of a processing film peeling experiment in which a peeling liquid is used to peel off a processing film from a major surface of a substrate on which a hydrophilic film is formed.

FIG. 9 is a table showing results of a particle removal experiment in which a processing film is peeled off from a major surface of a substrate and a particle removal efficiency after peeling off is measured.

DESCRIPTION OF EMBODIMENTS

<Arrangement of Substrate Processing Apparatus>

Figure 1:
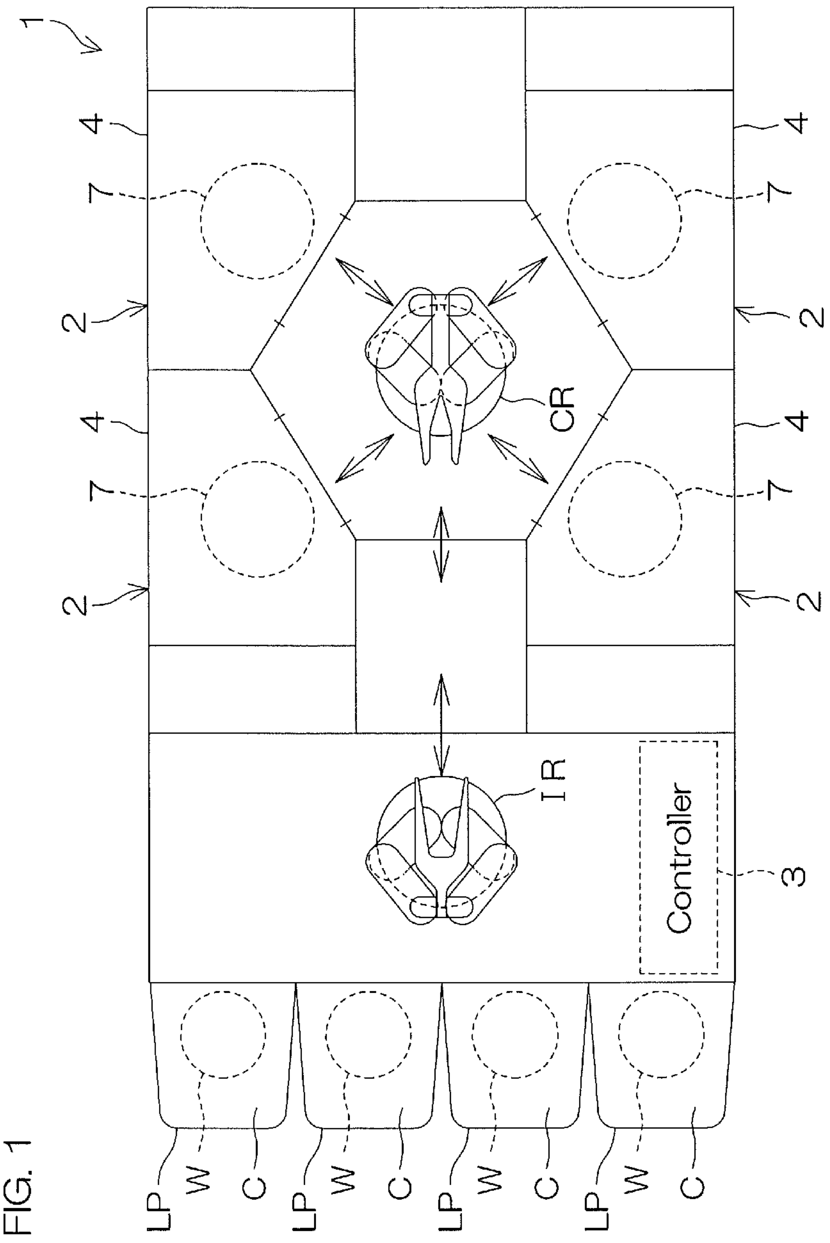
FIG. 1 is a plan view for describing an arrangement of a substrate processing apparatus according to a preferred embodiment of the present invention.

FIG. 1 is a plan view for describing an arrangement of a substrate processing apparatus 1 according to a preferred embodiment of the present invention.

The substrate processing apparatus 1 is a single substrate processing type apparatus that processes substrates W such as silicon wafers, etc., one by one. In the present preferred embodiment, each substrate W is a substrate of disk shape. The substrate W has a pair of major surfaces and is processed in an orientation in which either of the major surfaces is faced upward. At least one of the pair of major surfaces is a device surface on which an uneven pattern is formed. One of the pair of major surfaces may be a non-device surface on which an uneven pattern is not formed.

Each major surface of the substrate W is a hydrophobic surface on which a hydrophobic substance is exposed. The hydrophobic substance is, for example, amorphous carbon (a-C), silicon carbide (SiCN), or ruthenium (Ru). The hydrophobic surface is a surface on which, for example, one type among amorphous carbon, silicon carbide, and ruthenium or a plurality of types among these is or are exposed.

The hydrophobic surface is a surface with which a contact angle of deionized water (DIW) is not less than 40°. For example, if the hydrophobic substance is ruthenium, the contact angle of DIW with respect to the hydrophobic surface is 60°. If the hydrophobic substance is silicon carbide, the contact angle of DIW with respect to the hydrophobic surface is 60°. If the hydrophobic substance is amorphous carbon, the contact angle of DIW with respect to the hydrophobic surface is 50°. As long as the contact angle is not less than 40°, the hydrophobic substance may be substance other than the substances mentioned above.

Hydrophilic means that an affinity with respect to water is high and hydrophobic means that the affinity with respect to water is low. The contact angle is an index of hydrophilicity and hydrophobicity. The contact angle is a result of quantification of a degree of a bulge of a liquid droplet (height of a liquid) when a liquid is dropped onto a certain solid. Specifically, the contact angle is an angle formed by a liquid surface and a surface of a solid when water that has adhered to the surface of the solid is viewed from a side. The greater the contact angle, the lower the hydrophilicity of the surface of the solid and the smaller the contact angle, the higher the hydrophilicity of the surface of the solid.

The substrate processing apparatus 1 includes a plurality of processing units 2 for processing substrates W with fluids, load ports LP on which are placed carriers C that house a plurality of the substrates W to be processed by the processing units 2, transfer robots IR and CR that transfer the substrates W between the load ports LP and the processing units 2, and a controller 3 that controls the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same arrangement. Processing fluids supplied toward a substrate W inside a processing unit 2 include a hydrophilic film forming liquid, a film thickness reducing liquid, a processing film forming liquid, a peeling liquid, a rinse liquid, a residue removing liquid, a hydrophilic film removing liquid, etc., to be described below.

Each processing unit 2 includes a chamber 4 and a processing cup 7 disposed inside the chamber 4 and executes processing of the substrate W inside the processing cup 7. An inlet/outlet (not shown) for carrying in the substrates W and carrying out the substrates W by the transfer robot CR is formed at the chamber 4. The chamber 4 is provided with a shutter unit (not shown) for opening/closing the inlet/outlet.

Figure 2:
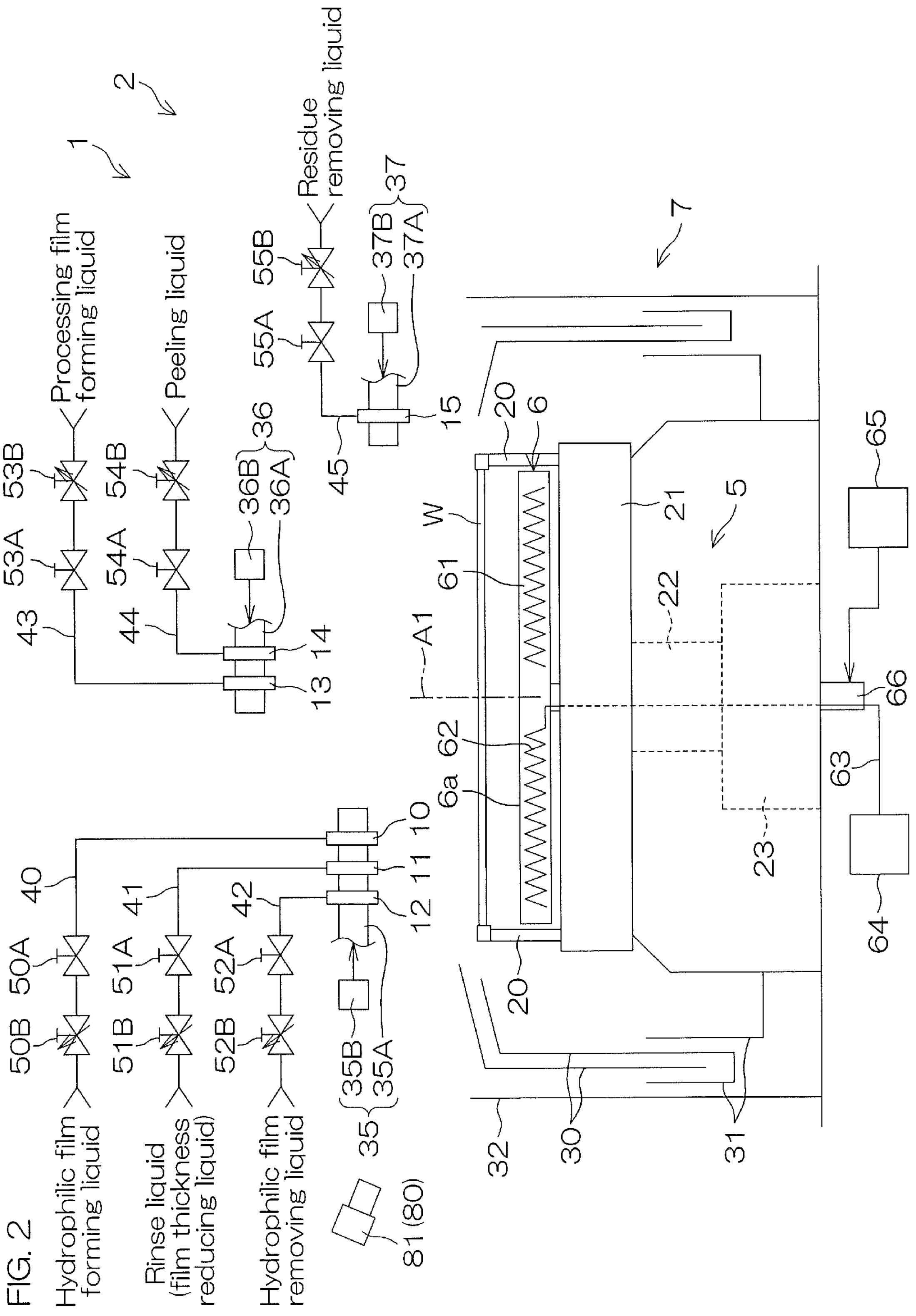
FIG. 2 is a schematic view for describing an arrangement example of a processing unit included in the substrate processing apparatus.

FIG. 2 is a schematic sectional view for describing an arrangement example of the processing unit 2.

The processing unit 2 further includes a spin chuck 5 that rotates the substrate W around a rotational axis A1 (a vertical axis) while holding the substrate W at a predetermined holding position and a heating member 6 that heats the substrate W held by the spin chuck 5. The rotational axis A1 is a vertical rectilinear line that passes through a central portion of the substrate W. The holding position is the position of the substrate W shown in FIG. 2 and is a position at which the substrate W is held in a horizontal orientation.

The spin chuck 5 includes a spin base 21 that has a disk shape oriented along a horizontal direction, a plurality of chuck pins 20 that grip the substrate W above the spin base 21 and hold the substrate W at the holding position, a rotating shaft 22 that has an upper end coupled to the spin base 21 and extends in a vertical direction, and a rotational driving member 23 that rotates the rotating shaft 22 around its central axis (rotational axis A1).

The plurality of chuck pins 20 are disposed on an upper surface of the spin base 21 at intervals in a circumferential direction of the spin base 21. The rotational driving member 23 is, for example, an actuator such as an electric motor, etc. The rotational driving member 23 rotates the rotating shaft 22 to rotate the spin base 21 and the plurality of chuck pins 20 around the rotational axis A1. The substrate W is thereby rotated around the rotational axis A1 together with the spin base 21 and the plurality of chuck pins 20.

The plurality of chuck pins 20 are movable between a closed position of gripping the substrate W by contacting a peripheral edge portion of the substrate W and an open position of being retreated from the peripheral edge portion of the substrate W. The plurality of chuck pins 20 are moved by an opening/closing mechanism (not shown). When positioned at the closed position, the plurality of chuck pins 20 grip the peripheral edge portion of the substrate W and hold the substrate W horizontally. The opening/closing mechanism includes, for example, a link mechanism and an actuator that applies a driving force to the link mechanism.

The heating member 6 has a form of a disk-shaped hot plate. The heating member 6 is disposed between the upper surface of the spin base 21 and a lower surface of the substrate W. The heating member 6 has a heating surface 6*a* facing the lower surface of the substrate W from below.

The heating member 6 includes a plate main body 61 and a heater 62. An upper surface of the plate main body 61 constitutes the heating surface 6*a*. The heater 62 may be a resistor body incorporated in the plate main body 61. By energizing the heater 62, the heating surface 6*a* is heated. A power supply or other energizing member 64 is connected via a feeder 63 to the heater 62 and a temperature of the heater 62 is adjusted by adjusting an electric current supplied from the energizing member 64.

The heating member 6 is elevated and lowered by a heater elevation/lowering driving mechanism 65. The plate main body 61 is connected to the heater elevation/lowering driving mechanism 65 via an elevating/lowering shaft 66. The heater elevation/lowering driving mechanism 65 includes, for example, an actuator (not shown) such as an electric motor or an air cylinder, etc., that elevatingly/loweringly drives the elevating/lowering shaft 66. The heating member 6 is capable of being elevated and lowered between the lower surface of the substrate W and the upper surface of the spin base 21. The heating member 6 may be enabled to perform transfer of the substrate W to and from the plurality of chuck pins 20 by elevation and lowering.

The processing cup 7 receives liquid splashed from the substrate W held by the spin chuck 5. The processing cup 7 includes a plurality (two in the example of FIG. 2) of guards 30 that receive liquid splashed outward from the substrate W held by the spin chuck 5, a plurality (two in the example of FIG. 2) of cups 31 that receive liquid guided downward by the plurality of guards 30, and an outer wall member 32 of circular cylindrical shape that surrounds the plurality of guards 30 and the plurality of cups 31. The plurality of guards 30 are elevated/lowered individually by a guard elevation/lowering driving mechanism (not shown). The guard elevation/lowering driving mechanism includes, for example, an actuator such as an electric motor or an air cylinder, etc., that elevatingly/loweringly drives each guard 30.

The processing unit 2 further includes a hydrophilic film forming liquid nozzle 10 supplying, toward an upper surface (major surface at an upper side) of the substrate W held by the spin chuck 5, the hydrophilic film forming liquid that is capable of forming a hydrophilic film, a hydrophilic film removing liquid nozzle 12 supplying, toward the upper surface of the substrate W, the hydrophilic film removing liquid that removes the hydrophilic film from the upper surface of the substrate W, and a rinse liquid nozzle 11 supplying, toward the upper surface of the substrate W, the rinse liquid that washes off a liquid on the upper surface of the substrate W.

A solute and a solvent are contained in the hydrophilic film forming liquid. The hydrophilic film of solid state or semisolid state is formed by at least a portion of the solvent in the hydrophilic film forming liquid volatilizing (evaporating). The solid state is a state where all of the solvent has evaporated and the hydrophilic film is formed by just the solute. The semisolid state is a state where the solvent remains in the hydrophilic film and the hydrophilic film is formed by the solvent and the solute.

The forming of the hydrophilic film can be confirmed, for example, by disappearance of interference fringes. The disappearance of interference fringes is confirmed, for example, by an image taking member 80 that takes an image of the upper surface of the substrate W (acquires image data of the upper surface of the substrate W). The image taking member 80 includes a camera 81 and a light source (not shown). The camera 81 includes a lens, an image taking element that converts an optical image formed by the lens to electric signals, and an image taking circuit that generates image signals based on the converted electric signals and transmits image data constituted of the image signals and time information to the controller 3 (see FIG. 1). The image taking element is, for example, a CCD (charge coupled device) sensor or a CMOS (complementary metal oxide semiconductor) sensor.

The hydrophilic film forming liquid contains a hydrophilic component as the solute. The hydrophilic component is an organic compound having, for example, a main chain (main skeleton) and a plurality of side chains that are bonded to the main chain. The plurality of side chains include a plurality of hydrophobic side chains and a plurality of hydrophilic side chains. The hydrophobic side chains are constituted of hydrophobic groups and the hydrophilic side chains are constituted of hydrophilic groups. As functional groups that constitute the side chains, there are more hydrophilic groups than hydrophobic groups.

The hydrophilic component is not necessarily restricted to one in which a portion that is a main chain is present and suffices to be an organic compound having hydrophilic groups and hydrophobic groups.

The hydrophobic groups (first hydrophobic groups) that the hydrophilic component has are each, for example, a hydrocarbon group. As the hydrocarbon group, an alkyl group, vinyl group, phenyl group, etc., can be cited. The hydrophilic groups (first hydrophilic groups) that the hydrophilic component has are each, for example, a hydroxy group, amino group, thiol group, aldehyde group, amide group (amide bond), carbonyl group, etc. The carbonyl group is a carboxylic acid (—COOH), aldehyde, ketone, ester, amide, enone, etc. The plurality of hydrophobic groups do not need to be of the same type and a plurality of types of hydrophobic groups may be present in the hydrophilic component. Similarly, the plurality of hydrophilic groups do not need to be of the same type and a plurality of types of hydrophilic groups may be present in the hydrophilic component. The hydrophilic component may have amine groups as the hydrophilic groups and have a pyridine skeleton as the main skeleton.

The hydrophilic component is, in particular, a nitrogen-containing polymer, a nitrogen-containing compound, or a saturated nitrogen-containing hydrocarbon ring, or a salt of any of these. The hydrophilic component is preferably a nitrogen-containing polymer.

As the nitrogen-containing polymer, a polyallylamine, a polydiallylamine, a polyvinylpyrrolidone, and a copolymer of these can be cited. The nitrogen-containing polymer may be polyethyleneimine. The nitrogen-containing polymer is preferably a polyallylamine or a polydiallylamine.

As the nitrogen-containing compound, for example, 1,4-diaminobutane, N,N'-bis(3-aminopropyl)ethylenediamine, N,N,N',N",N"-pentamethylethylenediamine, N,N,N',N'-tetramethylethylenediamine, and 2,6,10-trimethyl-2,6,10-triazaundecane can be cited. The nitrogen-containing compound may be a diallylamine, a triallylamine, 2-(2-aminoethylamino)ethanol, or diethanolamine, etc.

The saturated nitrogen-containing hydrocarbon ring may take on a cage type three-dimensional structure or may take on a planar ring structure. Although not intended to restrict the present invention, 1,4-diazabicyclo[2.2.2]octane and hexamethylenetetramine can be cited as specific examples of a saturated nitrogen-containing hydrocarbon ring having a cage type three-dimensional structure and 1,4,7,10-tetraazacyclododecane can be cited as a specific example of a saturated nitrogen-containing hydrocarbon ring having a planar ring structure.

The solvent of the hydrophilic film forming liquid is a liquid component that dissolves the hydrophilic component. The solvent contained in the hydrophilic film forming liquid suffices to be a substance that is a liquid and is capable dissolving the hydrophilic component at ordinary temperature and evaporates by rotation or heating of the substrate W.

The solvent of the hydrophilic film forming liquid is, for example, water such as DIW. An organic solvent may be contained in the solvent of the hydrophilic film forming liquid.

As the organic solvent contained as the solvent in the hydrophilic film forming liquid, an alcohol such as ethanol (EtOH), isopropanol (IPA), etc., an ethylene glycol monoalkyl ether such as ethylene glycol monomethyl ether, ethylene glycol monoethyl ether, etc., an ethylene glycol monoalkyl ether acetate such as ethylene glycol monomethyl ether acetate, ethylene glycol monoethyl ether acetate, etc., a propylene glycol monoalkyl ether such as propylene glycol monomethyl ether (PGME), propylene glycol monoethyl ether (PGEE), etc., a lactic acid ester such as methyl lactate, ethyl lactate (EL), etc., an aromatic hydrocarbon such as toluene, xylene, etc., a ketone such as methyl ethyl ketone, 2-heptanone, cyclohexanone, etc., and the like can be cited. Also, propylene glycol monomethyl ether acetate (PGMEA) can also be used as the organic solvent contained as the solvent in the hydrophilic film forming liquid. These organic solvents can be used alone or two or more types can be mixed and used.

A surfactant may be contained as a solute in addition to the hydrophilic component in the hydrophilic film forming liquid. The surfactant is useful for improving a coating property and solubility. As the surfactant, an anionic surfactant, a cationic surfactant, or a nonionic surfactant can be cited.

As the anionic surfactant, an alkyl sulfonate, an alkylbenzene sulfonic acid, and an alkylbenzene sulfonate can be cited.

As the cationic surfactant, lauryl pyridinium chloride and lauryl methylammonium chloride can be cited.

As the nonionic surfactant, polyoxyethylene octyl ether, polyoxyethylene lauryl ether, polyoxyethylene acetylenic glycol ether, or a fluorine-containing surfactant (for example, Fluorad (3M), MEGAFACE (DIC), and Surflon (AGC Seimi Chemical)) can be cited.

These surfactants can be used alone or two or more types can be mixed and used.

The rinse liquid is, for example, water such as deionized water. The rinse liquid is not restricted to DIW and suffices to be a liquid that contains at least one among DIW, electrolyzed ion water, and reduced water (hydrogen water). The rinse liquid is preferably the same liquid as the solvent of the hydrophilic film forming liquid. For example, if DIW is used as the solvent of the hydrophilic film forming liquid, it is preferable to use DIW as the rinse liquid as well.

The hydrophilic film removing liquid is a liquid that has a property of dissolving the hydrophilic component. The hydrophilic film removing liquid is, for example, an acidic liquid (acidic aqueous solution) such as hydrochloric acid, etc. An acidic chemical liquid that is used as the hydrophilic film removing liquid is not restricted to hydrochloric acid. The hydrophilic film removing liquid contains at least one among hydrophilic acid, dilute sulfuric acid (aqueous sulfuric acid solution), dilute nitric acid (aqueous nitric acid solution), formic acid, acetic acid, citric acid, and oxalic acid. As long as it can remove the hydrophilic film from the major surface of the substrate W, the hydrophilic film removing liquid does not have to be an aqueous solution and may be a liquid that contains an organic solvent as the solvent.

The hydrophilic film forming liquid nozzle 10, the rinse liquid nozzle 11, and the hydrophilic film removing liquid nozzle 12 are all moving nozzles that are movable at least in a horizontal direction. The hydrophilic film forming liquid nozzle 10, the rinse liquid nozzle 11, and the hydrophilic film removing liquid nozzle 12 are moved in the horizontal direction by a first nozzle moving mechanism 35. The first nozzle moving mechanism 35 includes a first arm 35A that supports the hydrophilic film forming liquid nozzle 10, the rinse liquid nozzle 11, and the hydrophilic film removing liquid nozzle 12 in common and a first arm moving mechanism 35B that moves the first arm 35A in the horizontal direction. The first arm moving mechanism 35B includes an actuator such as an electric motor or an air cylinder, etc.

The hydrophilic film forming liquid nozzle 10, the rinse liquid nozzle 11, and the hydrophilic film removing liquid nozzle 12 may, unlike in the present preferred embodiment, be movable in a vertical direction. The hydrophilic film forming liquid nozzle 10, the rinse liquid nozzle 11, and the hydrophilic film removing liquid nozzle 12 may, unlike in the present preferred embodiment, be fixed nozzles that are fixed in horizontal position and vertical position. The hydrophilic film forming liquid nozzle 10, the rinse liquid nozzle 11, and the hydrophilic film removing liquid nozzle 12 may be movable individually.

The hydrophilic film forming liquid nozzle 10 is connected to one end of a hydrophilic film forming liquid piping 40 that guides the hydrophilic film forming liquid to the hydrophilic film forming liquid nozzle 10. Another end of the hydrophilic film forming liquid piping 40 is connected to a hydrophilic film forming liquid tank (not shown). A hydrophilic film forming liquid valve 50A that opens and closes a flow passage inside the hydrophilic film forming liquid piping 40 and a hydrophilic film forming liquid flow control valve 50B that adjusts a flow rate of the hydrophilic film forming liquid inside the flow passage are interposed in the hydrophilic film forming liquid piping 40.

When the hydrophilic film forming liquid valve 50A is opened, the hydrophilic film forming liquid is discharged downward in a continuous flow from a discharge port of the hydrophilic film forming liquid nozzle 10 at a flow rate in accordance with an opening degree of the hydrophilic film forming liquid flow control valve 50B. The hydrophilic film forming liquid nozzle 10 is an example of a hydrophilic film forming liquid supplying member.

The rinse liquid nozzle 11 is connected to one end of a rinse liquid piping 41 that guides the rinse liquid to the rinse liquid nozzle 11. Another end of the rinse liquid piping 41 is connected to a rinse liquid tank (not shown). A rinse liquid valve 51A that opens and closes a flow passage inside the rinse liquid piping 41 and a rinse liquid flow control valve 51B that adjusts a flow rate of the rinse liquid inside the flow passage are interposed in the rinse liquid piping 41. When the rinse liquid valve 51A is opened, the rinse liquid is discharged downward in a continuous flow from a discharge port of the rinse liquid nozzle 11 at a flow rate in accordance with an opening degree of the rinse liquid flow control valve 51B.

The hydrophilic film removing liquid nozzle 12 is connected to one end of a hydrophilic film removing liquid piping 42 that guides the hydrophilic film removing liquid to the hydrophilic film removing liquid nozzle 12. Another end of the hydrophilic film removing liquid piping 42 is connected to a hydrophilic film removing liquid tank (not shown). A hydrophilic film removing liquid valve 52A that opens and closes a flow passage inside the hydrophilic film removing liquid piping 42 and a hydrophilic film removing liquid flow control valve 52B that adjusts a flow rate of the hydrophilic film removing liquid inside the flow passage are interposed in the hydrophilic film removing liquid piping 42. When the hydrophilic film removing liquid valve 52A is opened, the hydrophilic film removing liquid is discharged downward in a continuous flow from a discharge port of the hydrophilic film removing liquid nozzle 12 at a flow rate in accordance with an opening degree of the hydrophilic film removing liquid flow control valve 52B.

The processing unit 2 further includes a processing film forming liquid nozzle 13 supplying, toward the upper surface of the substrate W, the processing film forming liquid that is capable of forming a processing film and a peeling liquid nozzle 14 supplying, toward the upper surface of the substrate W, the peeling liquid that peels off the processing film from the upper surface of the substrate W.

Solutes and a solvent are contained in the processing film forming liquid. The processing film of solid state or semi-solid state is formed by at least a portion of the solvent in the processing film forming liquid volatilizing (evaporating). The processing film holds a particle or other removal object that is present on the substrate W. As with the hydrophilic film, forming of the processing film can be confirmed by disappearance of interference fringes.

A low solubility component and a high solubility component that is higher in solubility in the peeling liquid than the low solubility component are contained as the solutes in the processing film forming liquid. Substances that differ mutually in solubility in a removing liquid to be described below can be used as the low solubility component and the high solubility component. The low solubility component is also a hydrophobic component that is lower in hydrophilicity than the hydrophilic component contained in the hydrophilic film forming liquid.

The low solubility component is, for example, a novolac. The low solubility component is an organic compound having a main chain (main skeleton) and a plurality of side chains that are bonded to the main chain. The low solubility component is a hydrophobic component that is lower in hydrophilicity than the hydrophilic component contained in the hydrophilic film forming liquid. The plurality of side chains include a plurality of hydrophobic side chains and a plurality of hydrophilic side chains. The hydrophobic side chains are constituted of hydrophobic groups and the hydrophilic side chains are constituted of hydrophilic groups. A proportion of the hydrophilic side chains among the plurality of side chains of the low solubility component is smaller than a proportion of the hydrophilic side chains among the plurality of side chains of the hydrophilic component.

The low solubility component is not necessarily restricted to one in which a portion that is a main chain is present and suffices to be an organic compound having hydrophilic groups and hydrophobic groups that is lower in hydrophilicity than the hydrophilic component.

The hydrophobic groups (second hydrophobic groups) that the low solubility component has are, for example, hydrocarbon groups. As the hydrocarbon groups, alkyl groups, vinyl groups, phenyl groups, etc., can be cited. The hydrophilic groups (second hydrophilic groups) that the low solubility component has are, for example, hydroxy groups, amino groups, thiol groups, aldehyde groups, amide groups (amide bonds), carbonyl groups, etc. The plurality of hydrophobic groups do not need to be of the same type and a plurality of types of hydrophobic groups may be present in the low solubility component. Similarly, the plurality of hydrophilic groups do not need to be of the same type and a plurality of types of hydrophilic groups may be present in the low solubility component.

The high solubility component is, for example, 2,2-bis(4-hydroxyphenyl)propane. Although a portion that is a main skeleton is not necessarily present in the high solubility component, the high solubility component is an organic compound that contains a hydrocarbon group as a hydrophobic group and at least one among a hydroxy group and a carbonyl group as a hydrophilic group. Also, the high solubility component is higher in hydrophilicity than the low solubility component. The high solubility component may be an organic compound having a main chain (main skeleton) and a plurality of side chains that are bonded to the main chain.

The processing film is mainly constituted of the low solubility component in a solid state (low solubility solid) and the high solubility component in a solid state (high solubility solid). The solvent contained in the processing film forming liquid suffices to be a liquid that dissolves the low solubility component and the high solubility component. A corrosion inhibiting component may be contained in the processing film forming liquid. Although details shall be described later, the corrosion inhibiting component is, for example, BTA (benzotriazole).

The peeling liquid is a liquid that peels off the processing film from the major surface of the substrate W without peeling off the hydrophilic film. The peeling liquid is, for example, an alkaline liquid (aqueous alkaline solution) such as ammonia water, etc. A peeling liquid that is used as the peeling liquid is not restricted to ammonia water. The peeling liquid may be an aqueous TMAH (tetramethylammonium hydroxide) solution or an aqueous choline solution or any combination of these. The peeling liquid does not have to be an aqueous solution as long as it can remove the processing film without peeling off the hydrophilic film from the major surface of the substrate W.

The processing film forming liquid nozzle 13 and the peeling liquid nozzle 14 are both moving nozzles that are movable at least in a horizontal direction. The processing film forming liquid nozzle 13 and the peeling liquid nozzle 14 are moved in the horizontal direction by a second nozzle moving mechanism 36. The second nozzle moving mechanism 36 includes a second arm 36A that supports the processing film forming liquid nozzle 13 and the peeling liquid nozzle 14 in common and a second arm moving mechanism 36B that moves the second arm 36A in the horizontal direction. The second arm moving mechanism 36B includes an actuator such as an electric motor or an air cylinder, etc.

The processing film forming liquid nozzle 13 and the peeling liquid nozzle 14 may, unlike in the present preferred embodiment, be movable in a vertical direction. The processing film forming liquid nozzle 13 and the peeling liquid nozzle 14 may, unlike in the present preferred embodiment, be fixed nozzles that are fixed in horizontal position and vertical position. The processing film forming liquid nozzle 13 and the peeling liquid nozzle 14 may be movable individually.

The processing film forming liquid nozzle 13 is connected to one end of a processing film forming liquid piping 43 that guides the processing film forming liquid to the processing film forming liquid nozzle 13. Another end of the processing film forming liquid piping 43 is connected to a processing film forming liquid tank (not shown). A processing film forming liquid valve 53A that opens and closes a flow passage inside the processing film forming liquid piping 43 and a processing film forming liquid flow control valve 53B that adjusts a flow rate of the processing film forming liquid inside the flow passage are interposed in the processing film forming liquid piping 43. When the processing film forming liquid valve 53A is opened, the processing film forming liquid is discharged downward in a continuous flow from a discharge port of the processing film forming liquid nozzle 13 at a flow rate in accordance with an opening degree of the processing film forming liquid flow control valve 53B. The processing film forming liquid nozzle 13 is an example of a processing film forming liquid supplying member.

The peeling liquid nozzle 14 is connected to one end of a peeling liquid piping 44 that guides the peeling liquid to the peeling liquid nozzle 14. Another end of the peeling liquid piping 44 is connected to a peeling liquid tank (not shown). A peeling liquid valve 54A that opens and closes a flow passage inside the peeling liquid piping 44 and a peeling liquid flow control valve 54B that adjusts a flow rate of the peeling liquid inside the flow passage are interposed in the peeling liquid piping 44. When the peeling liquid valve 54A is opened, the peeling liquid is discharged downward in a continuous flow from a discharge port of the peeling liquid nozzle 14 at a flow rate in accordance with an opening degree of the peeling liquid flow control valve 54B. The peeling liquid nozzle 14 is an example of a peeling liquid supplying member.

The processing unit 2 further includes a residue removing liquid nozzle 15 supplying, toward the upper surface of the substrate W, the residue removing liquid that removes a residue of the processing film remaining on the upper surface of the substrate W.

The residue removing liquid preferably has compatibility with the rinse liquid and the acidic chemical liquid. The residue removing liquid dissolves the residue of the processing film. The residue removing liquid is thus also called a residue dissolving liquid. The residue removing liquid is, for example, an organic solvent and may be a liquid that includes at least one among IPA, HFE (hydrofluoroether), methanol, EtOH, acetone, PGEE, and trans-1,2-dichloroethylene.

The residue removing liquid nozzle 15 is a moving nozzle that is movable at least in a horizontal direction. The residue removing liquid nozzle 15 is moved in the horizontal direction by a third nozzle moving mechanism 37. The third nozzle moving mechanism 37 includes a third arm 37A that supports the residue removing liquid nozzle 15 and a third arm moving mechanism 37B that moves the third arm 37A in the horizontal direction. The third arm moving mechanism 37B includes an actuator such as an electric motor or an air cylinder, etc.

The residue removing liquid nozzle 15 may, unlike in the present preferred embodiment, be movable in a vertical direction. The residue removing liquid nozzle 15 may, unlike in the present preferred embodiment, be a fixed nozzle that is fixed in horizontal position and vertical position.

The residue removing liquid nozzle 15 is connected to one end of a residue removing liquid piping 45 that guides the residue removing liquid to the residue removing liquid nozzle 15. Another end of the residue removing liquid piping 45 is connected to a residue removing liquid tank (not shown). A residue removing liquid valve 55A that opens and closes a flow passage inside the residue removing liquid piping 45 and a residue removing liquid flow control valve 55B that adjusts a flow rate of the residue removing liquid inside the flow passage are interposed in the residue removing liquid piping 45. When the residue removing liquid valve 55A is opened, the residue removing liquid is discharged downward in a continuous flow from a discharge port of the residue removing liquid nozzle 15 at a flow rate in accordance with an opening degree of the residue removing liquid flow control valve 55B.

Figure 3:
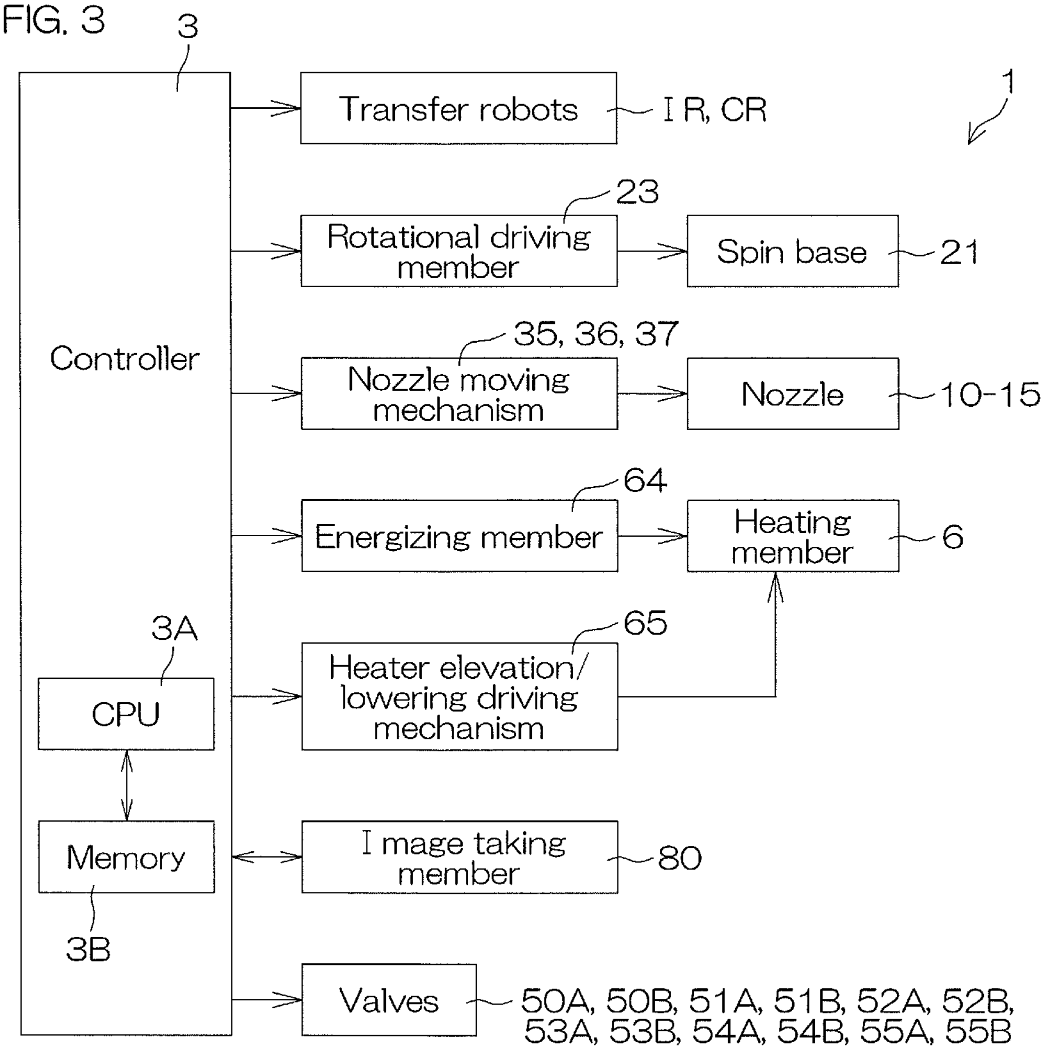
FIG. 3 is a block diagram for describing an arrangement example related to control of the substrate processing apparatus.

FIG. 3 is a block diagram for describing an arrangement example related to control of the substrate processing apparatus 1. The controller 3 includes a microcomputer and, in accordance with a predetermined control program, controls control objects included in the substrate processing apparatus 1.

Specifically, the controller 3 includes a processor (CPU) 3A and a memory 3B in which the control program is stored. The controller 3 is arranged to execute various controls for substrate processing by the processor 3A executing the control program.

In particular, the controller 3 is programmed to control the transfer robots IR and CR, the rotational driving member 23, the first nozzle moving mechanism 35, the second nozzle moving mechanism 36, the third nozzle moving mechanism 37, the energizing member 64, the heater elevation/lowering driving mechanism 65, the image taking member 80, the hydrophilic film forming liquid valve 50A, hydrophilic film forming liquid flow control valve 50B, the rinse liquid valve 51A, the rinse liquid flow control valve 51B, the hydrophilic film removing liquid valve 52A, the hydrophilic film removing liquid flow control valve 52B, the processing film forming liquid valve 53A, the processing film forming liquid flow control valve 53B, the peeling liquid valve 54A, the peeling liquid flow control valve 54B, the residue removing liquid valve 55A, the residue removing liquid flow control valve 55B, etc.

By the valves being controlled by the controller 3, discharge/non-discharge of fluids from the corresponding nozzles and discharge flow rates of fluids from the corresponding nozzles are controlled.

Respective steps described below are executed by the controller 3 controlling the above arrangements. In other words, the controller 3 is programmed to execute the respective steps described below.

<Example of Substrate Processing>

Figure 4:
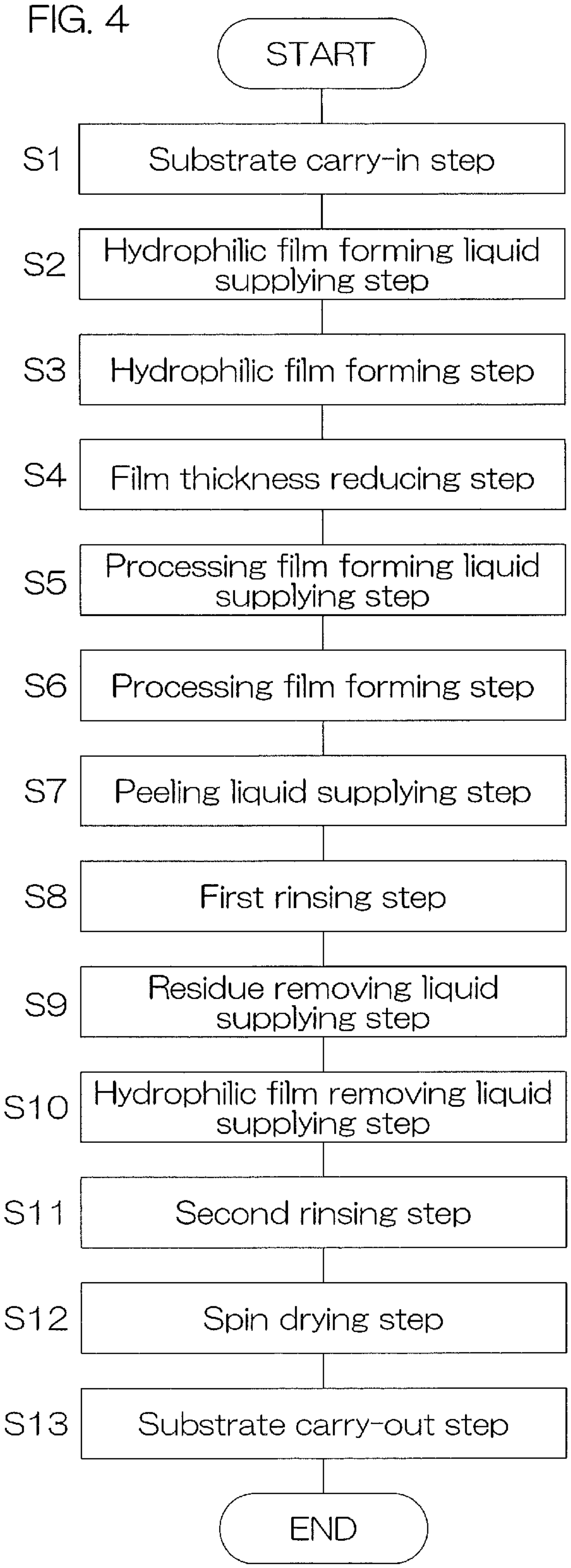
FIG. 4 is a flowchart for describing a flow of an example of substrate processing executed by the substrate processing apparatus.

FIG. 4 is a flowchart for describing an example of substrate processing executed by the substrate processing apparatus 1. Processing realized by the controller 3 executing the program is mainly shown in FIG. 4. FIG. 5A to FIG. 5I are schematic views for describing conditions of the respective steps of substrate processing executed by the substrate processing apparatus 1.

In the substrate processing by the substrate processing apparatus 1, for example, as shown in FIG. 4, a substrate carry-in step (step S1), a hydrophilic film forming liquid supplying step (step S2), a hydrophilic film forming step (step S3), a film thickness reducing step (step S4), a processing film forming liquid supplying step (step S5), a processing film forming step (step S6), a peeling liquid supplying step (step S7), a first rinsing step (step S8), a residue removing liquid supplying step (step S9), a hydrophilic film removing liquid supplying step (step S10), a second rinsing step (step S11), a spin drying step (step S12), and a substrate carry-out step (step S13) are executed in that order.

In the following, the substrate processing executed by the substrate processing apparatus 1 shall be described mainly with reference to FIG. 2 and FIG. 4. FIG. 5A to FIG. 5I shall be referenced where appropriate.

First, an unprocessed substrate W is carried from a carrier C into a processing unit 2 by the transfer robots IR and CR (see FIG. 1) and transferred to the spin chuck 5 (substrate carry-in step: step S1). The substrate W is thereby held horizontally by the spin chuck 5 (substrate holding step). The holding of the substrate W by the spin chuck 5 is continued until the spin drying step (step S12) ends.

Figure 5A:
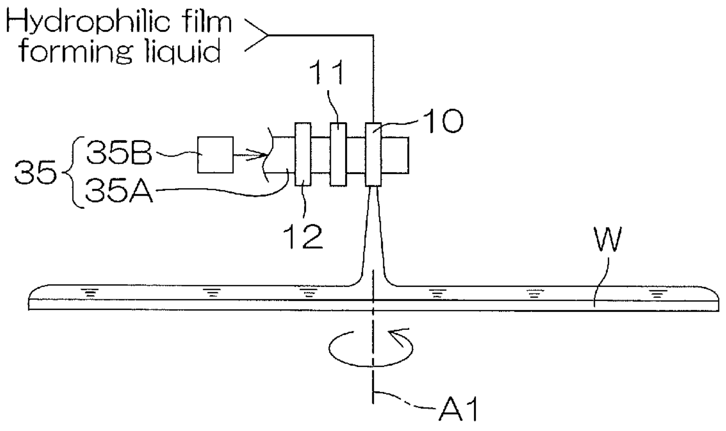
FIG. 5A is a schematic view for describing a condition of a substrate during the substrate processing.

Next, after the transfer robot CR has retreated outside the processing unit 2, the hydrophilic film forming liquid supplying step (step S2) of supplying the hydrophilic film forming liquid to the upper surface of the substrate W is executed. Specifically, the first nozzle moving mechanism 35 moves the hydrophilic film forming liquid nozzle 10 to a processing position and the hydrophilic film forming liquid valve 50A is opened in a state where the hydrophilic film forming liquid nozzle 10 is positioned at the processing position. Thereby, the hydrophilic film forming liquid is supplied toward the upper surface of the substrate W from the hydrophilic film forming liquid nozzle 10 as shown in FIG. 5A (hydrophilic film forming liquid supplying step). The hydrophilic film forming liquid discharged from the hydrophilic film forming liquid nozzle 10 lands on the upper surface of the substrate W.

In the present substrate processing, the processing position of the hydrophilic film forming liquid nozzle 10 is a central position at which the discharge port faces a central region of the upper surface of the substrate W. The hydrophilic film forming liquid therefore lands on the central region of the upper surface of the substrate W.

While the hydrophilic film forming liquid is being supplied to the upper surface of the substrate W, the substrate W may be rotated at a low speed (of, for example, 10 rpm) (first low speed rotating step). Or, rotation of the substrate W may be stopped while the hydrophilic film forming liquid is being supplied to the upper surface of the substrate W. By making a rotational speed of the substrate W a low speed or by stopping the rotation of the substrate W, the hydrophilic film forming liquid supplied to the substrate W stays at the central region of the upper surface of the substrate W. A usage amount of the hydrophilic film forming liquid can thereby be reduced.

The supply of the hydrophilic film forming liquid is continued at a predetermined supply flow rate for a predetermined hydrophilic film forming liquid supply period. The hydrophilic film forming liquid supply period is, for example, not less than 5 seconds and not more than 30 seconds. The supply flow rate of the hydrophilic film forming liquid is, for example, 500 mL/min.

Figure 5B:
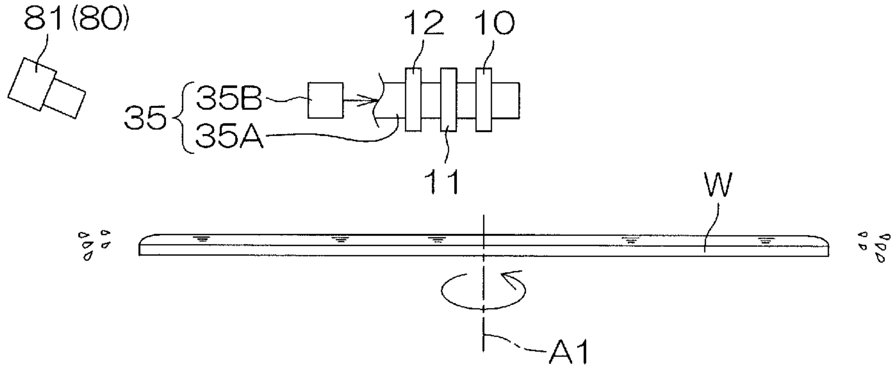
FIG. 5B is a schematic view for describing the condition of the substrate during the substrate processing.
Figure 5C:
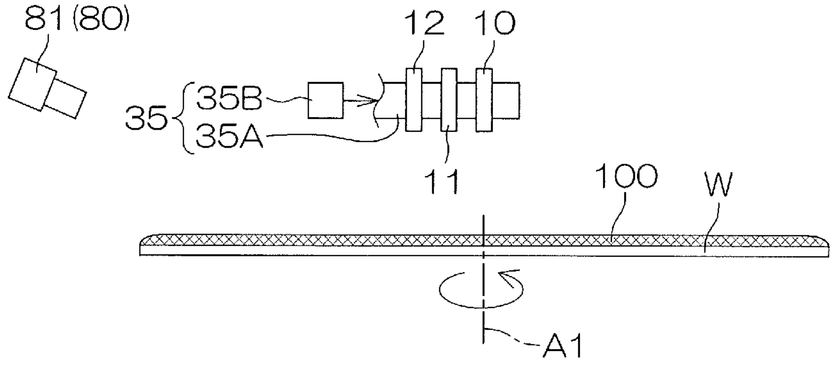
FIG. 5C is a schematic view for describing the condition of the substrate during the substrate processing.

Next, as shown in FIG. 5B and FIG. 5C, the substrate W with the hydrophilic film forming liquid adhered to the upper surface is rotated to execute the hydrophilic film forming step (step S3) of forming a hydrophilic film 100 (see FIG. 5C) on the upper surface of the substrate W.

Specifically, the hydrophilic film forming liquid valve 50A is closed and the discharge of the hydrophilic film forming liquid from the hydrophilic film forming liquid nozzle 10 is stopped. After the hydrophilic film forming liquid valve 50A is closed, the rotation of the substrate W is accelerated such that the rotational speed of the substrate W becomes a predetermined first spin-off speed as shown in FIG. 5B (first rotation accelerating step). The first spin-off speed is, for example, 1500 rpm. A first spin-off step is executed, for example, for 20 seconds.

The hydrophilic film forming liquid that has been retained at the central region of the upper surface of the substrate W is spread toward a peripheral edge portion of the upper surface of the substrate W by a centrifugal force due to the rotation of the substrate W. The hydrophilic film forming liquid is thereby spread across an entirety of the upper surface of the substrate W. As shown in FIG. 5B, a portion of the hydrophilic film forming liquid on the substrate W splashes outside the substrate W from a peripheral edge portion of the substrate W and a liquid film of the hydrophilic film forming liquid on the substrate W is thinned (first spin-off step).

The hydrophilic film forming liquid on the upper surface of the substrate W does not have to splash outside the substrate W and suffices to spread across the entirety of the upper surface of the substrate W due to action of the centrifugal force of the rotation of the substrate W.

The centrifugal force due to the rotation of the substrate W acts not just on the hydrophilic film forming liquid on the substrate W but also on a gas in contact with the hydrophilic film forming liquid on the substrate W. Therefore, by the action of the centrifugal force, the gas forms a gas stream directed toward a peripheral edge side from a center side of the upper surface of the substrate W. By the gas stream, a solvent in a gas state in contact with the hydrophilic film forming liquid on the substrate W is eliminated from an atmosphere in contact with the substrate W. Evaporation (volatilization) of the solvent from the hydrophilic film forming liquid on the substrate W is therefore promoted and the hydrophilic film 100 is formed as shown in FIG. 5C (hydrophilic film forming step).

The hydrophilic film forming liquid nozzle 10 and the rotational driving member 23 thus function as a hydrophilic film forming unit. A thickness of the hydrophilic film 100 formed by the hydrophilic film forming step is, for example, not less than 20 nm and not more than 30 nm.

Next, the film thickness reducing step (step S4) of reducing the thickness of the hydrophilic film 100 by dissolving the hydrophilic film 100 in the rinse liquid is performed.

Figure 5D:
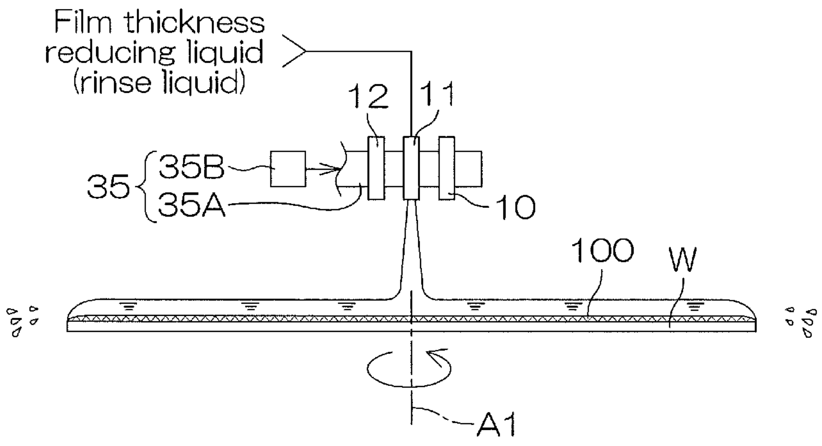
FIG. 5D is a schematic view for describing the condition of the substrate during the substrate processing.

Specifically, the first nozzle moving mechanism 35 moves the rinse liquid nozzle 11 to a processing position and the rinse liquid valve 51A is opened in a state where the rinse liquid nozzle 11 is positioned at the processing position. Thereby, the rinse liquid is supplied toward the upper surface of the substrate W from the rinse liquid nozzle 11 as shown in FIG. 5D (rinse liquid supplying step). The rinse liquid discharged from the rinse liquid nozzle 11 lands on the upper surface of the substrate W. The rinse liquid supplied to the upper surface of the substrate W spreads across the entirety of the upper surface of the substrate W due to the centrifugal force. In the present substrate processing, the processing position of the rinse liquid nozzle 11 is the central position and the rinse liquid therefore lands on the central region of the upper surface of the substrate W.

The supply of the rinse liquid to the upper surface of the substrate W may be started after elapse of a predetermined period from when the first spin-off step is started. Or, a timing of starting the supply of the rinse liquid to the upper surface of the substrate W may be determined by monitoring a state of the upper surface of the substrate W during the substrate processing.

As mentioned above, the forming of the hydrophilic film 100 can be confirmed by the disappearance of interference fringes. A timing at which the film thickness reducing liquid supplying step is started (timing at which the rinse liquid valve 51A is opened) is thus at the same time as when the interference fringes disappear or when a predetermined period (for example, of 5 seconds) elapses further after the interference fringes disappear. For example, if the controller 3 judges whether or not the forming of the hydrophilic film 100 is completed based on image data acquired at predetermined intervals (for example, 1 second intervals) by the image taking member 80 (hydrophilic film formation judging step), the film thickness reducing liquid supplying step can be started at an appropriate timing. Specifically, the controller 3 monitors the upper surface of the substrate W until the hydrophilic film 100 is formed and opens the rinse liquid valve 51A when it judges that the forming of the hydrophilic film 100 is completed.

A portion of the hydrophilic film 100 is dissolved by the rinse liquid that adheres to the upper surface of the substrate W (strictly speaking, a front surface of the hydrophilic film 100). The thickness of the hydrophilic film 100 on the upper surface of the substrate W is thereby reduced (film thickness reducing step). The thickness of the hydrophilic film 100 after the film thickness reducing step has been executed is, for example, not less than 1 Å (angstrom) and not more than 10 Å. The rinse liquid thus functions as the film thickness reducing liquid that reduces the thickness of the hydrophilic film 100. The rinse liquid supplying step is thus an example of the film thickness reducing liquid supplying step of supplying the film thickness reducing liquid toward the upper surface of the substrate W. Similarly, the rinse liquid nozzle 11 is an example of a film thickness reducing liquid supplying member.

The supply of the rinse liquid as the film thickness reducing liquid is continued at a predetermined supply flow rate for a predetermined film thickness reducing period. The film thickness reducing period is, for example, not less than 5 seconds and not more than 30 seconds. The supply flow rate of the rinse liquid is, for example, 2000 mL/min. The rotational speed of the substrate W in the film thickness reducing step is, for example, 1500 rpm.

Figure 5E:
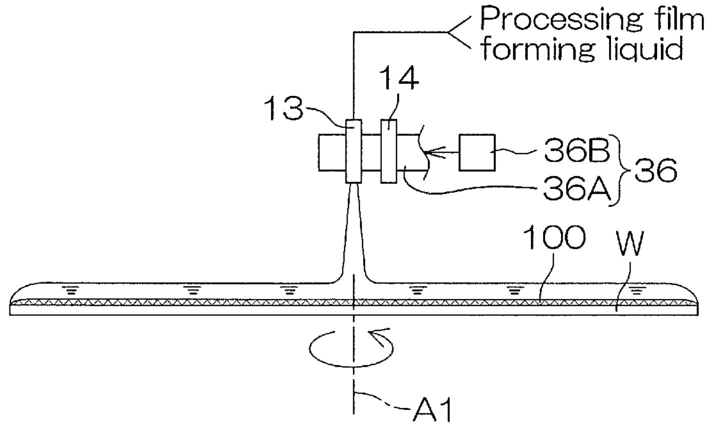
FIG. 5E is a schematic view for describing the condition of the substrate during the substrate processing.

Next, after the film thickness reducing step, the processing film forming liquid supplying step (step S5) of supplying the processing film forming liquid toward the upper surface of the substrate W is executed. Specifically, the second nozzle moving mechanism 36 moves the processing film forming liquid nozzle 13 to a processing position and the processing film forming liquid valve 53A is opened in a state where the processing film forming liquid nozzle 13 is positioned at the processing position. Thereby, the processing film forming liquid is supplied toward the upper surface of the substrate W from the processing film forming liquid nozzle 13 as shown in FIG. 5E (processing film forming liquid supplying step). The processing film forming liquid discharged from the processing film forming liquid nozzle 13 lands on the upper surface of the substrate W. In the present substrate processing, the processing position of the processing film forming liquid nozzle 13 is the central position and the processing film forming liquid therefore lands on the central region of the upper surface of the substrate W.

The rinse liquid valve 51A is closed before the processing film forming liquid valve 53A is opened. After the rinse liquid valve 51A is closed, the first nozzle moving mechanism 35 moves the rinse liquid nozzle 11 to a retreat position. The retreat position is a position that does not face the upper surface of the substrate W and is positioned outside the processing cup 7 in plan view.

While the processing film forming liquid is being supplied to the upper surface of the substrate W, the substrate W may be rotated at a low speed (of, for example, 10 rpm) (second low speed rotating step). Or, rotation of the substrate W may be stopped while the processing film forming liquid is being supplied to the upper surface of the substrate W. By making a rotational speed of the substrate W a low speed or by stopping the rotation of the substrate W, the processing film forming liquid supplied to the substrate W stays at the central region of the upper surface of the substrate W. A usage amount of the processing film forming liquid can thereby be reduced.

The supply of the processing film forming liquid is continued at a predetermined supply flow rate for a predetermined processing film forming liquid supply period. The processing film forming liquid supply period is, for example, not less than 2 seconds and not more than 4 seconds. The supply flow rate of the processing film forming liquid is, for example, 1.0 mL/min.

Figure 5F:
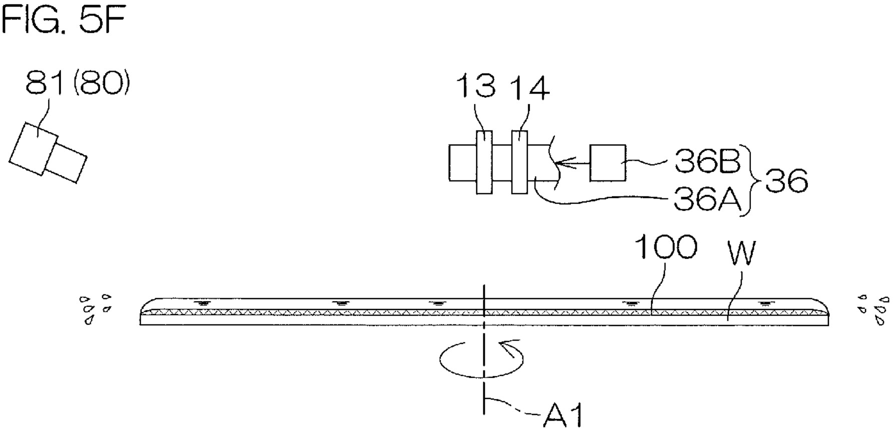
FIG. 5F is a schematic view for describing the condition of the substrate during the substrate processing.
Figure 5G:
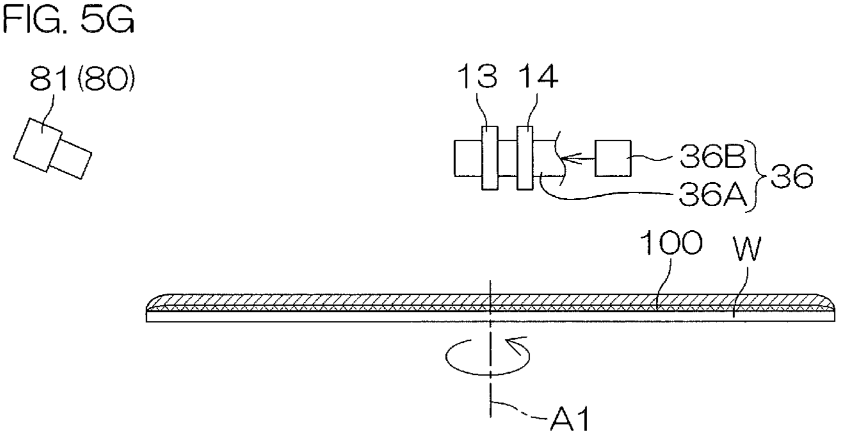
FIG. 5G is a schematic view for describing the condition of the substrate during the substrate processing.

Next, as shown in FIG. 5F and FIG. 5G, the processing film forming step (step S6) of rotating the substrate W with the processing film forming liquid adhered to the upper surface to form a processing film 101 (see FIG. 5G) on the upper surface of the substrate W is executed.

Specifically, the processing film forming liquid valve 53A is closed and the discharge of the hydrophilic film forming liquid from the processing film forming liquid nozzle 13 is stopped. After the processing film forming liquid valve 53A is closed, the rotation of the substrate W is accelerated such that the rotational speed of the substrate W becomes a predetermined second spin-off speed as shown in FIG. 5F (second rotation accelerating step). The second spin-off speed is, for example, 1500 rpm. A second spin-off step is executed, for example, for 30 seconds.

The processing film forming liquid that has been retained at the central region of the upper surface of the substrate W is spread toward the peripheral edge portion of the upper surface of the substrate W by a centrifugal force due to the rotation of the substrate W. The processing film forming liquid is thereby spread across the entirety of the upper surface of the substrate W. As shown in FIG. 5F, a portion of the processing film forming liquid on the substrate W splashes outside the substrate W from the peripheral edge portion of the substrate W and a liquid film of the processing film forming liquid on the substrate W is thinned (second spin-off step).

The processing film forming liquid on the upper surface of the substrate W does not have to splash outside the substrate W and suffices to spread across the entirety of the upper surface of the substrate W due to action of the centrifugal force of the rotation of the substrate W.

As in the hydrophilic film forming step, a gas in contact with the processing film forming liquid on the substrate W may form a gas stream directed toward the peripheral edge side from the center side of the upper surface of the substrate W due to action of the centrifugal force due to the rotation of the substrate W. By the gas stream, evaporation (volatilization) of the solvent from the processing film forming liquid on the substrate W is promoted and the processing film 101 is formed as shown in FIG. 5G (processing film forming step). The processing film forming liquid nozzle 13 and the rotational driving member 23 thus function as a processing film forming unit. A thickness of the processing film 101 formed by the processing film forming step is, for example, not less than 100 nm and not more than 200 nm.

Figure 5H:
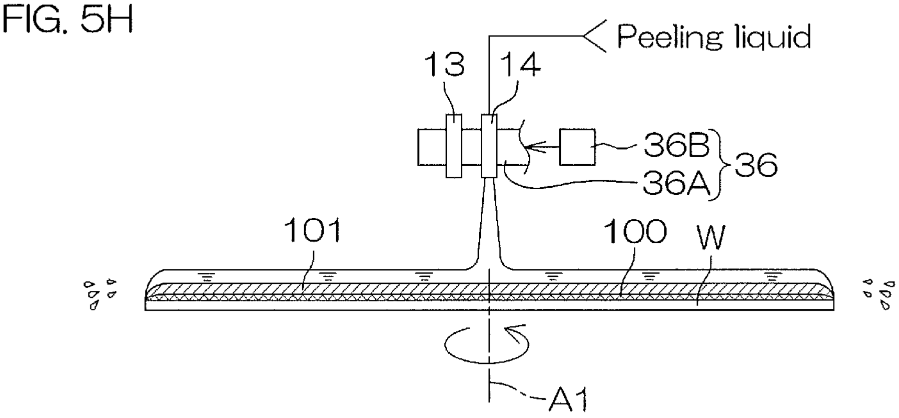
FIG. 5H is a schematic view for describing the condition of the substrate during the substrate processing.
Figure 5:
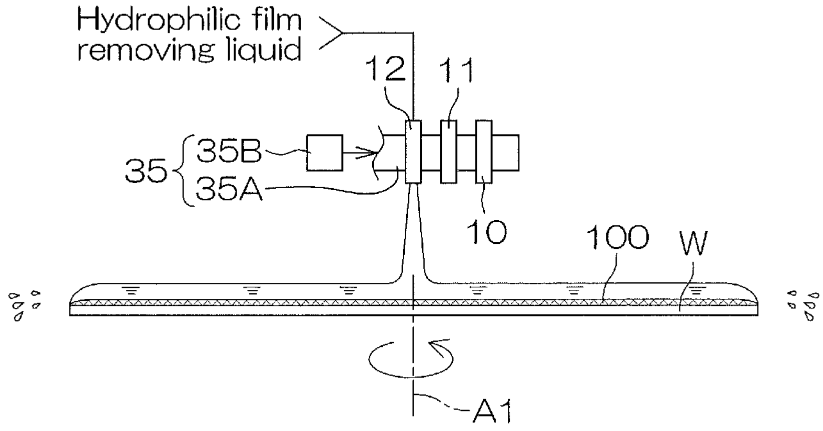
FIG. 5I is a schematic view for describing the condition of the substrate during the substrate processing.

Next, after the processing film forming step, the peeling liquid supplying step (step S7) of supplying the peeling liquid toward the upper surface of the substrate W is executed. Specifically, the second nozzle moving mechanism 36 moves the peeling liquid nozzle 14 to a processing position and the peeling liquid valve 54A is opened in a state where the peeling liquid nozzle 14 is positioned at the processing position. By the peeling liquid valve 54A being opened, the peeling liquid is supplied from the peeling liquid nozzle 14 toward the upper surface of the substrate W in the rotating state as shown in FIG. 5H (peeling liquid supplying step). The peeling liquid discharged from the peeling liquid nozzle 14 lands on the upper surface of the substrate W. The peeling liquid supplied to the upper surface of the substrate W spreads across the entirety of the substrate W due to the centrifugal force. In the present substrate processing, the processing position of the peeling liquid nozzle 14 is the central position and the peeling liquid therefore lands on the central region of the upper surface of the substrate W.

The peeling liquid supplied to the upper surface of the substrate W, while dissolving a portion (high solubility component) of the processing film 101, reaches an interface between the upper surface of the substrate W and the processing film 101 and enters between the processing film 101 and the upper surface of the substrate W. By continuing to supply the peeling liquid, the processing film 101 is peeled off and removed from the front surface of the hydrophilic film 100 (processing film removing step). On the other hand, the hydrophilic film 100 is maintained on the upper surface of the substrate W.

The peeling liquid supplying step may be started after elapse of a predetermined period from when the second spin-off step is started. Or, a timing of starting the peeling liquid supplying step may, as described in regard to the film thickness reducing step (step S4), be determined by monitoring the state of the upper surface of the substrate W during the substrate processing.

After the peeling liquid supplying step, the first rinsing step (step S8) of washing the upper surface of the substrate W and the residue removing liquid supplying step (step S9) of supplying a residue removing liquid toward the upper surface of the substrate W are executed successively.

Specifically, the first nozzle moving mechanism 35 moves the rinse liquid nozzle 11 to the processing position and the rinse liquid valve 51A is opened in the state where the rinse liquid nozzle 11 is positioned at the processing position. Thereby, the rinse liquid is supplied toward the upper surface of the substrate W from the rinse liquid nozzle 11 (rinse liquid supplying step). The rinse liquid supplied to the upper surface of the substrate W spreads across the entirety of the substrate W due to the centrifugal force. The peeling liquid adhered to the upper surface of the substrate W is thereby washed off by the rinse liquid and the peeling liquid is eliminated from the upper surface of the substrate W (first rinsing step). The hydrophilic film 100 is formed on the upper surface of the substrate W and therefore, strictly speaking, the peeling liquid is eliminated from the front surface of the hydrophilic film 100.

The peeling liquid valve 54A is closed before the rinse liquid valve 51A is opened. After the peeling liquid valve 54A is closed, the second nozzle moving mechanism 36 moves the peeling liquid nozzle 14 to a retreat position.

After the rinse liquid has been supplied toward the upper surface of the substrate W for a predetermined time, the third nozzle moving mechanism 37 moves the residue removing liquid nozzle 15 to a processing position. The residue removing liquid valve 55A is opened in the state where the residue removing liquid nozzle 15 is positioned at the processing position. Thereby, the residue removing liquid is supplied toward the upper surface of the substrate W from the residue removing liquid nozzle 15 (residue removing liquid supplying step). The residue removing liquid supplied to the upper surface of the substrate W spreads across the entirety of the substrate W due to the centrifugal force. A residue of the processing film 101 adhered to the upper surface of the substrate W (strictly speaking, the front surface of the hydrophilic film 100) is thereby dissolved by the residue removing liquid and is eliminated together with the residue removing liquid from the upper surface of the substrate W (residue removing step). In the present substrate processing, the processing position of the residue removing liquid nozzle 15 is the central position and the residue removing liquid therefore lands on the central region of the upper surface of the substrate W.

After the residue removing liquid supplying step (step S9), the hydrophilic film removing liquid supplying step (step S10) of supplying the hydrophilic film removing liquid toward the upper surface of the substrate W is executed. Specifically, the first nozzle moving mechanism 35 moves the hydrophilic film removing liquid nozzle 12 to a processing position and the hydrophilic film removing liquid valve 52A is opened in a state where the hydrophilic film removing liquid nozzle 12 is positioned at the processing position. Thereby, the hydrophilic film removing liquid is supplied toward the upper surface of the substrate W from the hydrophilic film removing liquid nozzle 12 as shown in FIG. 5I (hydrophilic film removing liquid supplying step). The hydrophilic film removing liquid discharged from the hydrophilic film removing liquid nozzle 12 lands on the upper surface of the substrate W. The hydrophilic film removing liquid supplied to the upper surface of the substrate W spreads across the entirety of the substrate W due to the centrifugal force. In the present substrate processing, the processing position of the hydrophilic film removing liquid nozzle 12 is the central position and the hydrophilic film removing liquid therefore lands on the central region of the upper surface of the substrate W.

By the hydrophilic film removing liquid being supplied to the upper surface of the substrate W, the hydrophilic film 100 held on the upper surface of the substrate W is dissolved by the hydrophilic film removing liquid and eliminated together with the hydrophilic film removing liquid from the upper surface of the substrate W (hydrophilic film removing step).

The residue removing liquid valve 55A is closed before the hydrophilic film removing liquid valve 52A is opened. After the residue removing liquid valve 55A is closed, the third nozzle moving mechanism 37 moves the residue removing liquid nozzle 15 to a retreat position.

After the hydrophilic film removing liquid supplying step, the second rinsing step (step S11) of washing the upper surface of the substrate W is executed. Specifically, the first nozzle moving mechanism 35 moves the rinse liquid nozzle 11 to the processing position and the rinse liquid valve 51A is opened in the state where the rinse liquid nozzle 11 is positioned at the processing position. Thereby, the rinse liquid is supplied toward the upper surface of the substrate W from the rinse liquid nozzle 11 (rinse liquid supplying step). The rinse liquid supplied to the upper surface of the substrate W spreads across the entirety of the substrate W due to the centrifugal force. The hydrophilic film removing liquid adhered to the upper surface of the substrate W is thereby washed off by the rinse liquid and the hydrophilic film removing liquid is eliminated from the upper surface of the substrate W (second rinsing step).

The hydrophilic film removing liquid valve 52A is closed before the rinse liquid valve 51A is opened. After the hydrophilic film removing liquid valve 52A is closed, the first nozzle moving mechanism 35 moves the hydrophilic film removing liquid nozzle 12 to a retreat position.

Next, the spin drying step (step S12) of drying the upper surface of the substrate W by rotating the substrate W at high speed is executed. Specifically, the rinse liquid valve 51A is closed. The supply of the rinse liquid to the upper surface of the substrate W is thereby stopped.

The rotational driving member 23 then accelerates the rotation of the substrate W and rotates the substrate W at high speed. The substrate W is rotated at a drying speed of, for example, 1500 rpm. Thereby, a large centrifugal force acts on the rinse liquid on the substrate W and the rinse liquid on the substrate W is spun off to a periphery of the substrate W. Thereafter, the rotational driving member 23 stops the rotation of the substrate W.

After the rotation of the substrate W is stopped, the transfer robot CR enters into the processing unit 2, lifts up the processed substrate W from the spin chuck 5, and carries it outside the processing unit 2 (substrate carry-out step: step S13). The substrate W is transferred from the transfer robot CR to the transfer robot IR and housed in a carrier C by the transfer robot IR.

<Condition of Upper Surface of Substrate During Substrate Processing>

Next, a condition of the upper surface of the substrate W during substrate processing shall be described in detail using FIG. 6A to FIG. 6H. FIG. 6A to FIG. 6H are schematic views for describing the condition of a vicinity of the upper surface of the substrate W during the substrate processing.

Figure 6A:
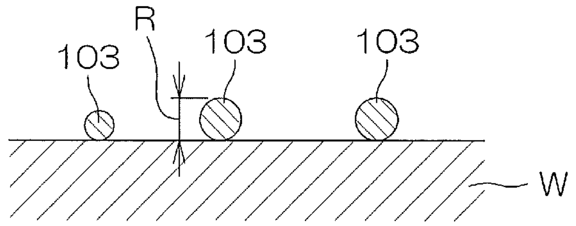
FIG. 6A is a schematic view for describing a condition of a vicinity of an upper surface of the substrate during the substrate processing.

FIG. 6A shows the condition of the upper surface of the substrate W before the substrate processing is executed. Before the substrate processing is executed, removal objects 103 such as particles, etc., are adhered to the upper surface of the substrate W. Particle diameters R of the removal objects 103 are, for example, 15 nm.

Figure 6B:
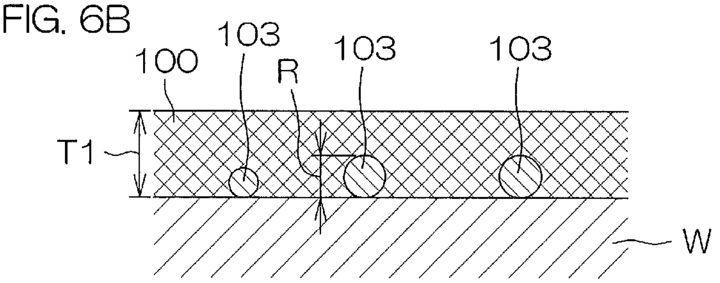
FIG. 6B is a schematic view for describing the condition of the vicinity of the upper surface of the substrate during the substrate processing.

The hydrophilic film 100 formed in the hydrophilic film forming step (step S3) is adhered to the upper surface of the substrate W as shown in FIG. 6B. A thickness T1 of the hydrophilic film 100 is, for example, not less than 20 nm and not more than 30 nm and is normally greater than the particle diameters R of the removal objects 103.

The thickness T1 of the hydrophilic film 100 is a width of the hydrophilic film 100 in an orthogonal direction with respect to the upper surface of the substrate W. If the upper surface of the substrate W is a flat surface, the orthogonal direction with respect to the upper surface of the substrate W is coincident with a thickness direction of the substrate W. If a circuit pattern is formed, the thickness T1 of the hydrophilic film 100 at a side surface of a structure that constitutes the circuit pattern is a width of the hydrophilic film 100 in a direction that intersects the thickness direction of the substrate W. The same applies to thicknesses T2 and T3 described below.

Figure 6C:
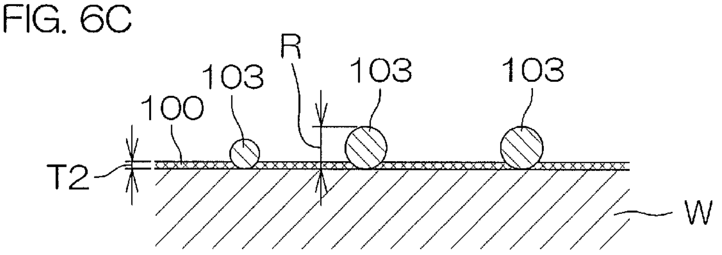
FIG. 6C is a schematic view for describing the condition of the vicinity of the upper surface of the substrate during the substrate processing.

As shown in FIG. 6C, the thickness T2 of the hydrophilic film 100 after the film thickness reducing step (step S4) has been executed is smaller than the particle diameters R of the removal objects 103 and is, for example, not less than 1 Å and not more than 10 Å. The removal objects 103 are exposed from the front surface of the hydrophilic film 100. By making the thickness of the hydrophilic film 100 the thickness T2 that is smaller than the particle diameters of the removal objects 103, large portions of surfaces of the removal objects 103 can be exposed from the front surface of the hydrophilic film 100.

The thickness T3 of the processing film 101 formed in the processing film forming step (step S3) is greater than the particle diameters R of the removal objects 103 and is, for example, not less than 100 nm and not more than 200 nm.

Figure 6D:
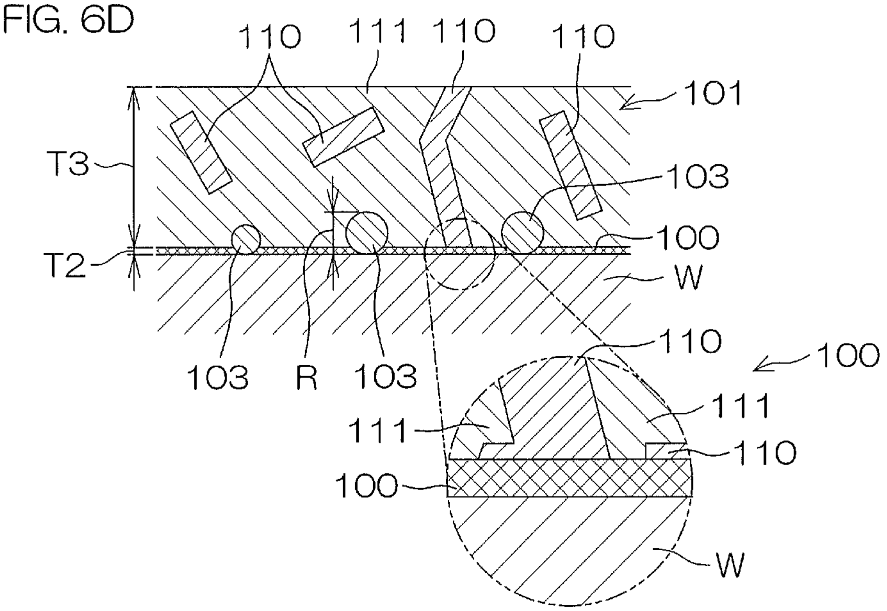
FIG. 6D is a schematic view for describing the condition of the vicinity of the upper surface of the substrate during the substrate processing.

The processing film 101 holds the removal objects 103 as shown in FIG. 6D. To hold the removal objects 103 means to hold the removal objects 103 by at least either of physical holding with which the removal objects 103 are taken into an interior of the processing film 101 and chemical holding with which the removal objects 103 are adsorbed by the processing film 101 by a chemical interaction (for example, by an intermolecular force or an ionic bond).

The processing film 101 does not contact the upper surface of the substrate W directly and is formed on the front surface of the hydrophilic film 100 that is formed on the upper surface of the substrate W. The processing film 101 contains the high solubility component (high solubility solids 110) that is in the solid state and the low solubility component (low solubility solids 111) that is in the solid state. The high solubility solids 110 and the low solubility solids 111 are formed by at least a portion of the solvent contained in the processing film forming liquid evaporating.

The high solubility solids 110 and the low solubility solids 111 are not necessarily dispersed uniformly inside the processing film 101 and the processing film 101 is constituted of portions in which the low solubility solids 111 are comparatively largely present (locally concentrated) and portions in which the high solubility solids 110 are comparatively largely present (locally concentrated).

Figure 6E:
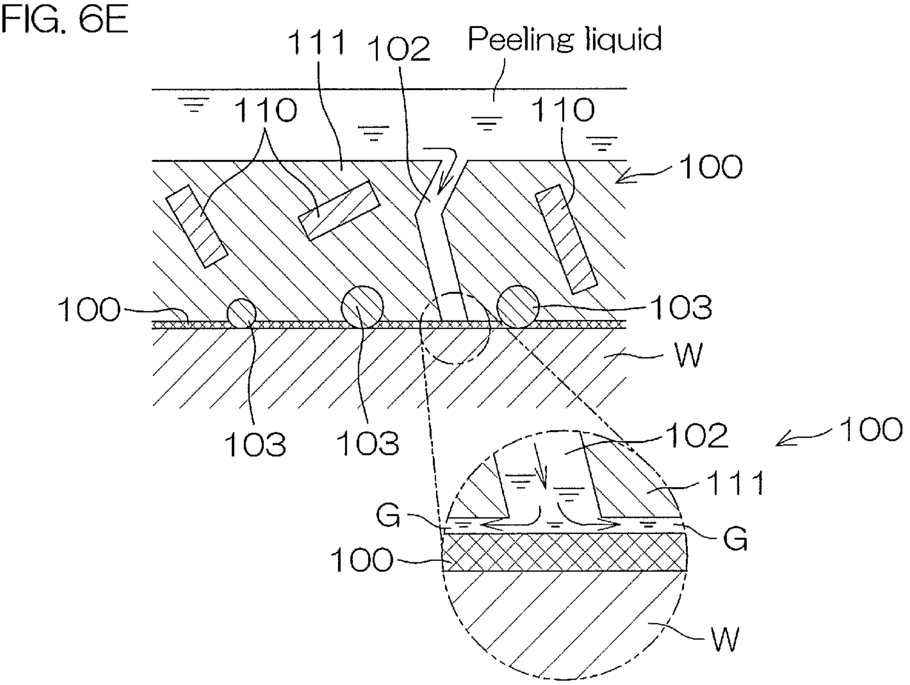
FIG. 6E is a schematic view for describing the condition of the vicinity of the upper surface of the substrate during the substrate processing.

Referring to FIG. 6E, the high solubility solids 110 are selectively dissolved by the peeling liquid that is supplied to the upper surface of the substrate W in the peeling liquid supplying step (step S7). That is, the processing film 101 is partially dissolved (dissolving step, partially dissolving step).

That the "high solubility solids 110 are selectively dissolved" does not mean that just the high solubility solids 110 in the solid state are dissolved but means that although the low solubility solids 111 are also dissolved slightly, a large portion of the high solubility solids 110 is dissolved. Starting with the selective dissolution of the high solubility solids 110, penetrating holes 102 are formed as peeling liquid paths in the portions of the processing film 101 in which the high solubility solids 110 are locally concentrated (penetrating hole forming step).

The penetrating holes 102 are of a size, for example, of several nm in diameter. The penetrating holes 102 do not have to be formed clearly to an observable degree. That is, it suffices that the peeling liquid paths that move the peeling liquid from the front surface of the processing film 101 to the upper surface of the substrate W are formed in the processing film 101 and it suffices that the peeling liquid paths penetrate through the processing film 101 as a whole.

Here, if the solvent remains moderately inside the processing film 101, that is, if the processing film 101 is in a semisolid state, the peeling liquid dissolves the processing film 101 partially while dissolving into the solvent remaining in the processing film 101. In detail, the peeling liquid, while dissolving into the solvent remaining inside the processing film 101, dissolves the high solubility solids 110 and forms the penetrating holes 102 inside the processing film 101. The peeling thus enters readily inside the processing film 101 (dissolution entry step). The peeling liquid passes through the penetrating holes 102 to reach an interface between the hydrophilic film 100 and the processing film 101 (interface with respect to the low solubility solids 111).

The peeling liquid that has reached the front surface of the hydrophilic film 100 acts on the contact interface between the processing film 101 and the hydrophilic film 100 to peel off the processing film 101 from the hydrophilic film 100 and remove the peeled processing film 101 from the hydrophilic film 100 (peeling removal step).

In detail, the solubility of the low solubility solids 111 with respect to the peeling liquid is low and a large portion of the low solubility solids 111 is maintained in the solid state. The peeling liquid that reaches a vicinity of the hydrophilic film 100 via the penetrating holes 102 thus slightly dissolves portions of the low solubility solids 111 in the vicinity of the hydrophilic film 100. Thereby, as shown in an enlarged view in FIG. 6E, the peeling liquid enters into gaps G between the processing film 101 and the hydrophilic film 100 while gradually dissolving the low solubility solids 111 in the vicinity of the hydrophilic film 100 (peeling liquid entry step).

As shown in an enlarged view in FIG. 6D, due to interaction of the hydrophilic component of the hydrophilic film 100 and the high solubility component of the processing film 101, not just the low solubility solids 111 but also the high solubility solids 110 are present in a vicinity of the contact interface between the hydrophilic film 100 and the processing film 101 (details shall be described below). The peeling liquid thus dissolves not just the low solubility solids 111 but also the high solubility solids 110 in the peeling liquid entry step. Therefore, in comparison to a case where just the low solubility solids 111 are present in the vicinity of the contact interface between the hydrophilic film 100 and the processing film 101, the peeling liquid enters readily into the contact interface between the processing film 101 and the hydrophilic film 100.

Figure 6F:
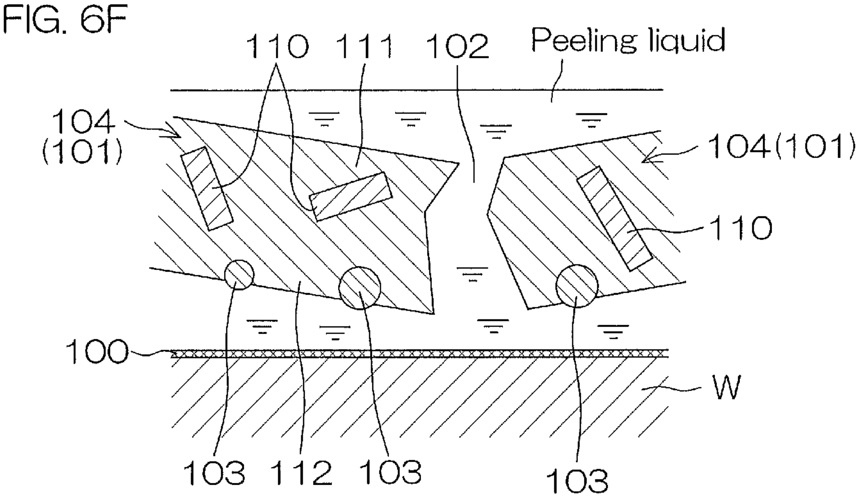
FIG. 6F is a schematic view for describing the condition of the vicinity of the upper surface of the substrate during the substrate processing.

Cracks form in the processing film 101 with peripheral edges of the penetrating holes 102 as starting points. The high solubility solids 110 are thus also called crack forming components. The processing film 101 splits due to the forming of the cracks and become film pieces 104. As shown in FIG. 6F, the film pieces 104 of the processing film 101 are peeled off from the substrate W in a state of holding the removal objects 103 (processing film splitting step, processing film removing step).

By then continuing the supply of the peeling liquid, the processing film 101 that has become the film pieces 104 is washed off, in the state of holding the removal objects 103, by the peeling liquid. In other words, the film pieces 104 holding the removal objects 103 are forced away out of the substrate W and eliminated from the upper surface of the substrate W (processing film eliminating step, removal object eliminating step). The upper surface of the substrate W can thereby be cleaned satisfactorily.

Thus, by supplying the peeling liquid to the upper surface of the substrate W, the high solubility solids 110 are dissolved and the processing film 101 is peeled off from the hydrophilic film 100.

Figure 6G:
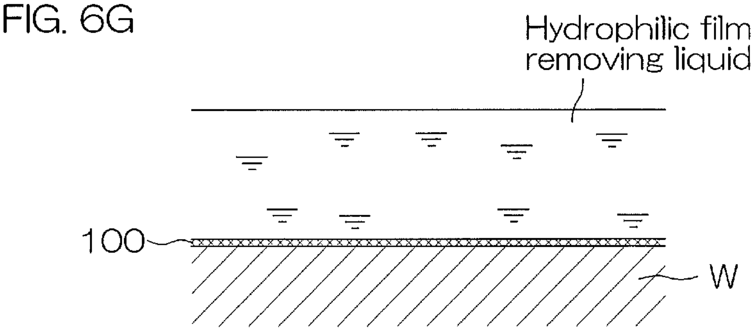
FIG. 6G is a schematic view for describing the condition of the vicinity of the upper surface of the substrate during the substrate processing.
Figure 6H:
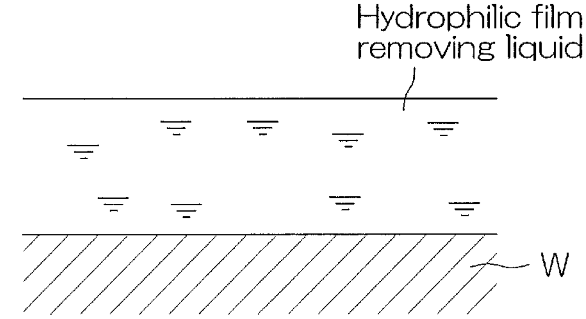
FIG. 6H is a schematic view for describing the condition of the vicinity of the upper surface of the substrate during the substrate processing.

While the removal objects 103 are removed together with the processing film 101 by the peeling liquid, the hydrophilic film 100 is maintained on the upper surface of the substrate W. As shown in FIG. 6G, by the hydrophilic film removing liquid supplied to the upper surface of the substrate W in the hydrophilic film removing liquid supplying step (step S10), the hydrophilic film 100 on the upper surface of the substrate W is dissolved (hydrophilic film dissolving step). By continuing the supply of the hydrophilic film removing liquid, the hydrophilic film 100 can be removed from the upper surface of the substrate W as shown in FIG. 6H.

According to the present preferred embodiment, it is possible to falsely hydrophilize the upper surface of the substrate W by forming the hydrophilic film 100 on the upper surface of the substrate W. Strictly speaking, properties of the upper surface of the substrate W are not changed per se. Increasing of hydrophilicity of a portion forming a contact interface with the processing film 101 by interposing the hydrophilic film 100 between the processing film 101 and the upper surface of the substrate W is expressed as "falsely hydrophilizing the upper surface of the substrate W."

By falsely hydrophilizing the upper surface of the substrate W by forming the hydrophilic film 100, it is made easy for the peeling liquid to enter between the upper surface of the substrate W and the processing film 101, or in detail, into the contact interface between the processing film 101 and the hydrophilic film 100. The processing film 101 in the state of holding the removal objects 103 present on the upper surface of the substrate W can thus be peeled off satisfactorily from the upper surface of the substrate W.

Also, with the present preferred embodiment, the thickness of the hydrophilic film 100 is reduced by the film thickness reducing liquid (rinse liquid) before the processing film 101 is peeled off from the hydrophilic film 100. The removal objects 103 present on the upper surface of the substrate W can thus be exposed satisfactorily from the hydrophilic film 100. Therefore, by forming the processing film 101 on the front surface of the hydrophilic film 100 that has been reduced in thickness, the removal objects 103 can be held firmly by the processing film 101. The removal objects 103 can thus be removed satisfactorily together with the processing film 101 by subsequent supply of the peeling liquid.

Thus, even if the upper surface of the substrate W is a hydrophobic surface, that is, regardless of the state of the upper surface of the substrate W, the removal objects 103 can be removed satisfactorily from the upper surface of the substrate W.

Also with the present preferred embodiment, the hydrophilic film 100 is dissolved by the film thickness reducing liquid such that the thickness T2 of the hydrophilic film 100 is made smaller than the particle diameters R of the removal objects 103. The removal objects 103 can thus be exposed even more satisfactorily from the front surface of the hydrophilic film 100. Therefore, the removal objects 103 can be held even more firmly by the processing film 101. Therefore, the removal objects 103 can be removed satisfactorily together with the processing film 101 by subsequent supply of the peeling liquid.

If, unlike in the present preferred embodiment, the upper surface of the substrate is changed chemically, there are cases where it is difficult to return the upper surface of the substrate to a state before the substrate processing. However, with the present preferred embodiment, the hydrophilic film removing liquid is supplied toward the upper surface of the substrate W after the peeling liquid supplying step. Since the chemical properties of the upper surface of the substrate W itself are thus not changed by forming the hydrophilic film 100 on the upper surface of the substrate W, the upper surface of the substrate W can be returned to the state before substrate processing by removing the hydrophilic film 100. Therefore, after removing the removal objects 103, the upper surface of the substrate W can be returned to the state before the hydrophilic film 100 is formed, that is, to the hydrophobic surface. Consequently, the trouble of restoring the original properties of the upper surface of the substrate after the end of substrate processing can be avoided.

Also, with the present preferred embodiment, the processing film forming liquid contains the high solubility component and the low solubility component that is less soluble in the peeling liquid than the high solubility component. Thus, by supplying the peeling liquid toward the major surface of the substrate W, the high solubility solids 110 in the processing film 101 can be selectively dissolved in the peeling liquid. The peeling liquid thus moves toward the contact interface between the processing film 101 and the hydrophilic film 100 while selectively dissolving the high solubility solids 110. The peeling liquid can thereby form the peeling liquid paths (penetrating holes 102) inside the processing film 101. After the peeling liquid paths have been formed by dissolution of the high solubility component, the peeling liquid reaches the contact interface between the processing film 101 and the hydrophilic film 100 efficiently via the peeling liquid paths. The peeling liquid can thereby be made to act effectively on the contact interface between the processing film 101 and the hydrophilic film 100.

On the other hand, a large portion of the low solubility solids 111 in the processing film 101 is not dissolved by the peeling liquid and thus the removal objects 103 can be held by the low solubility solids 111. Consequently, the processing film 101 can be peeled off quickly from the upper surface of the substrate W and the removal objects 103, together with the processing film 101, can be washed away efficiently to an exterior of the upper surface of the substrate W by a flow of the peeling liquid.

<Conditions of Respective Components in Hydrophilic Film and Processing Film During Substrate Processing>

Figure 7A:
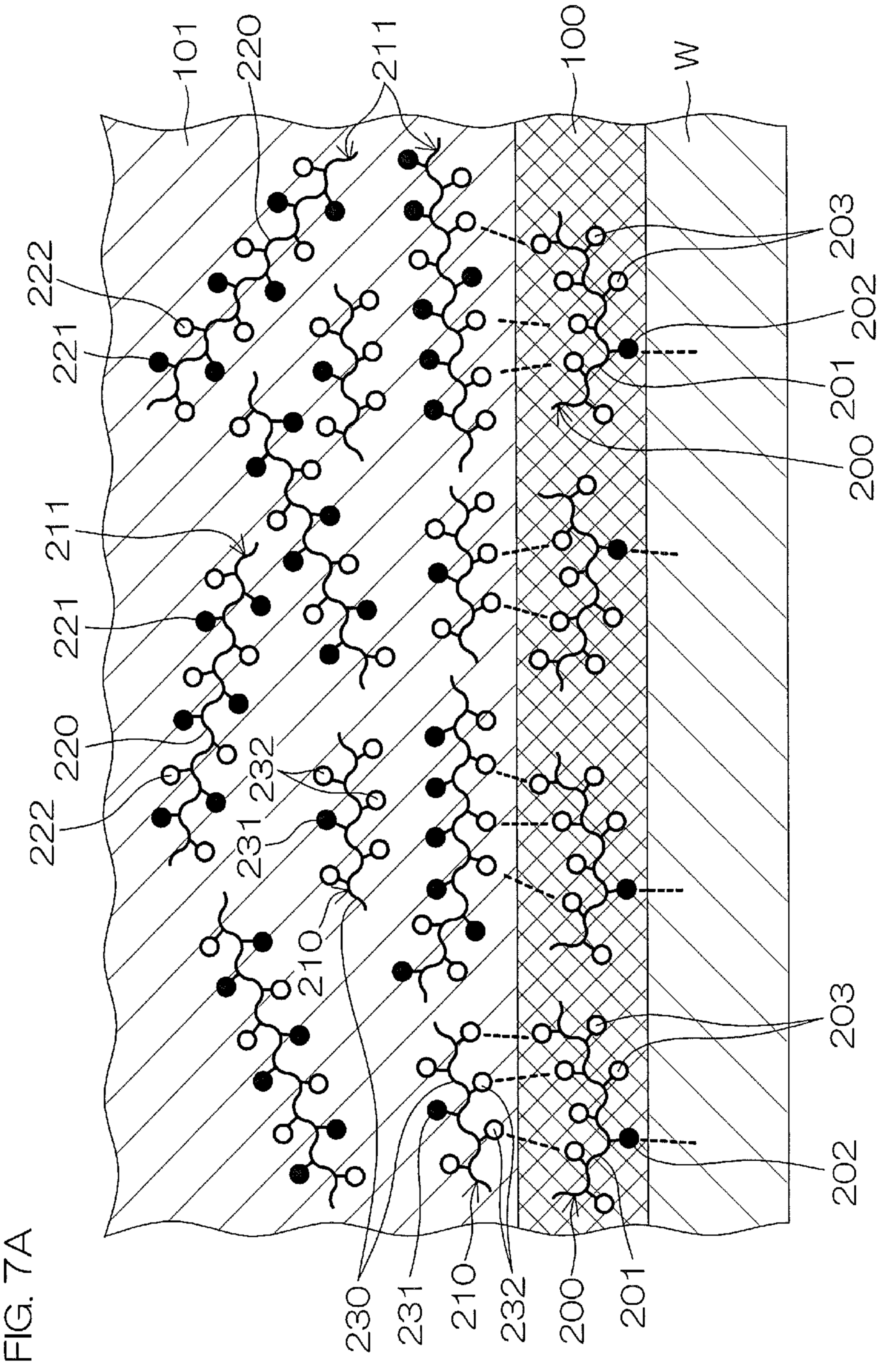
FIG. 7A is a schematic view for describing conditions of respective components in the vicinity of the upper surface of the substrate in a state where a hydrophilic film and a processing film are formed in the substrate processing.

FIG. 7A is a schematic view for describing conditions of respective components (the hydrophilic component, the low solubility component, and the high solubility component) in the vicinity of the upper surface of the substrate W in a state where the hydrophilic film 100 and the processing film 101 are formed in the substrate processing. With FIG. 7A, the respective components in the vicinity of the upper surface of the substrate W shall be described for an example where each of the hydrophilic component, the low solubility component, and the high solubility component has a main chain and side chains.

At least a hydrophilic component 200 is contained in the hydrophilic film 100. The hydrophilic component 200 has a main chain 201 and a plurality of the side chains that are bonded to the main chain 201. The plurality of side chains include a plurality of hydrophobic side chains 202 and a plurality of hydrophilic side chains 203. The number of hydrophilic side chains 203 is greater than the number of hydrophobic side chains 202.

At least a low solubility component 211 and a high solubility component 210 are contained in the processing film 101. The low solubility component 211 has a main chain 220 and a plurality of the side chains that are bonded to the main chain 220. The plurality of side chains include a plurality of hydrophobic side chains 221 and a plurality of hydrophilic side chains 222. If the low solubility component 211 is a novolac, the main chain 220 has a phenyl group, the hydrophobic side chains 221 each have a methyl group, and hydrophilic side chains 222 each have a hydroxy group.

The high solubility component 210 has a main chain 230 and a plurality of the side chains that are bonded to the main chain 230. The plurality of side chains include a plurality of hydrophobic side chains 231 and a plurality of hydrophilic side chains 232. If the high solubility component 210 is 2-bis(4-hydroxyphenyl)propane, the main chain 230 has a phenyl group, the hydrophobic side chains 231 each have a methyl group, and hydrophilic side chains 232 each have a hydroxy group.

Since the hydrophilic component 200 has hydrophobic groups (the hydrophobic side chains 202) and hydrophilic groups (hydrophilic side chains 203) and has more of the hydrophilic side chains 203 than the hydrophobic side chains 202, it can expose a surface (the front surface of the hydrophilic film 100) that is sufficiently high in hydrophilicity. There thus occur interactions of the hydrophilic side chains 203 of the hydrophilic film 100 with respect to the hydrophilic side chains 222 of the low solubility component 211 and the hydrophilic side chains 232 of the high solubility component 210 in the processing film 101. A large amount of hydrophilic groups is therefore present at the contact interface between the hydrophilic film 100 and the processing film 101 and not just the low solubility component 211 but the high solubility component 210 is also present in a vicinity of the contact interface between the hydrophilic film 100 and the processing film 101.

By hydrophilizing the upper surface of the substrate W by forming the hydrophilic film 100, it is made easy for the peeling liquid to enter between the upper surface of the substrate W and the processing film 101, or in detail, into the contact interface between the processing film 101 and the hydrophilic film 100. The processing film 101 in the state of holding the removal objects 103 present on the upper surface of the substrate W can thus be peeled off satisfactorily from the upper surface of the substrate W.

Further, since the hydrophilic component 200 has the hydrophobic side chains 202, an interaction can be made to occur between the hydrophobic side chains 202 and the hydrophobic surface. A large amount of hydrophobic groups is present at a contact interface between the hydrophilic film 100 and the substrate W and it is difficult for the peeling liquid to enter thereinto.

Figure 7B:
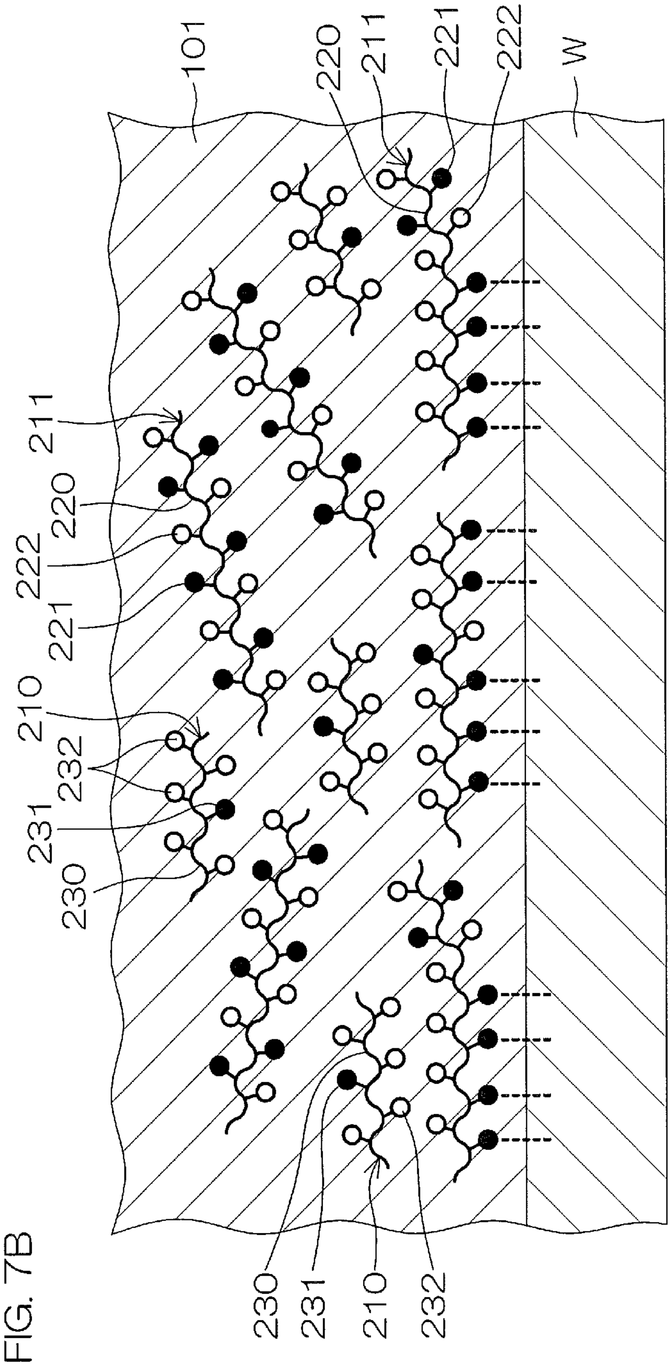
FIG. 7B is a schematic view for describing conditions of respective components in the vicinity of the upper surface of the substrate in a substrate processing of a reference example in which a hydrophilic film is not formed.

The hydrophilicity of the low solubility component 211 is lower than the hydrophilicity of the hydrophilic component 200. Thus, if, as in a substrate processing of a reference example shown in FIG. 7B, the processing film 101 is formed on the hydrophobic surface of the substrate W without forming the hydrophilic film 100, a hydrophobic interaction occurs between the low solubility component 211 in the processing film 101 and the upper surface of the substrate W. The processing film 101 is held on the upper surface of the substrate W by the hydrophobic interaction and made difficult to be peeled off by the peeling liquid.

In detail, a large amount of hydrophobic groups is present at a contact interface between the processing film 101 and the substrate W and the hydrophobic interaction occurs between the hydrophobic side chains 221 of the low solubility component 211 in the processing film 101 and the upper surface of the substrate W. It is thus difficult for the peeling liquid to enter into the contact interface between the processing film 101 and the substrate W.

On the other hand, with the present preferred embodiment, the processing film 101 is formed on the front surface of the hydrophilic film 100. That is, the hydrophilic film 100 is formed between the processing film 101 and the upper surface of the substrate W. Therefore, the hydrophobic interaction between the processing film 101 and the upper surface of the substrate W can be suppressed. Since the peeling liquid can thus be made to act satisfactorily on the interface between the processing film 101 and the hydrophilic film 100, the processing film 101 can be peeled off satisfactorily. Therefore, by forming the hydrophilic film 100, the processing film 101 can be peeled off satisfactorily even when the upper surface of the substrate W is a hydrophobic surface.

An affinity of the peeling liquid with respect to the contact interface of the hydrophilic film 100 and the processing film 101 is thus higher than an affinity of the peeling liquid with respect to the contact interface of the substrate W and the hydrophilic film 100. Thus, by the peeling liquid, the processing film 101 can be peeled off from the hydrophilic film 100 while suppressing the peeling off of the hydrophilic film 100 from the upper surface of the substrate W and maintaining the hydrophilic film 100 on the upper surface of the substrate W.

<Details of the Processing Film Forming Liquid>

The respective components in the processing film forming liquid used in the preferred embodiment described above shall now be described.

In the following, entries such as "$C_{x-y}$," "$C_x$-$C_y$," "$C_x$," etc., signify the number of carbon atoms in a molecule or a substituent. For example, $C_{1-6}$ alkyl signifies an alkyl chain having not less than 1 and not more than 6 carbon atoms (methyl, ethyl, propyl, butyl, pentyl, hexyl, etc.).

If a polymer has a plurality of types of repeating units, the repeating units are copolymerized. Unless restrictedly mentioned otherwise, such copolymerization may be any of alternate copolymerization, random copolymerization, block copolymerization, graft copolymerization, or a mixture of any of these. When a polymer or a resin is represented by a structural formula, n, m, etc., indicated alongside in parentheses indicate the number of repetitions.

<Low Solubility Component>

The low solubility component (A) includes at least one among novolacs, polyhydroxystyrenes, polystyrenes, polyacrylic acid derivatives, polymaleic acid derivatives, polycarbonates, polyvinyl alcohol derivatives, polymethacrylic acid derivatives, and copolymers that are combinations of these. Preferably, the low solubility component (A) may include at least one among novolacs, polyhydroxystyrenes, polyacrylic acid derivatives, polycarbonates, polymethacrylic acid derivatives, and copolymers that are combinations of these. More preferably, the low solubility component (A) may include at least one among novolacs, polyhydroxystyrenes, polycarbonates, and copolymers that are combinations of these. The novolac may be a phenol novolac.

The processing film forming liquid may contain one or a combination of two or more of the preferable examples mentioned above as the low solubility component (A). For example, the low solubility component (A) may include both a novolac and a polyhydroxystyrene.

As a preferred mode, the low solubility component (A) becomes a film upon being dried and the film is peeled off by the peeling liquid without a large portion thereof becoming dissolved and while holding the removal object. A mode where a very small portion of the low solubility component (A) is dissolved by the peeling liquid is allowable.

The low solubility component (A) preferably does not contain fluorine and/or silicon and more preferably contains neither.

The copolymerization is preferably random copolymerization or block polymerization.

Although not intended to restrict the scope of rights, the respective compounds represented by chemical formula 4 to chemical formula 10 indicated below can be cited as specific examples of the low solubility component (A).

[Chemical Formula 4]

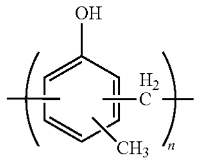

[Chemical Formula 5]

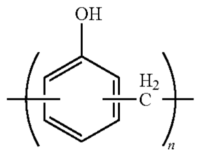

-continued

[Chemical Formula 6]

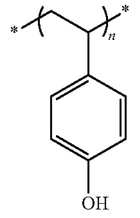

(The asterisk * indicates bonding to a neighboring constituent unit.)

[Chemical Formula 7]

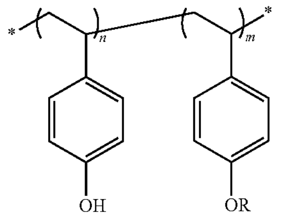

(R means a substituent such as a $C_{1-4}$ alkyl, etc. The asterisk * indicates bonding to a neighboring constituent unit.)

[Chemical Formula 8]

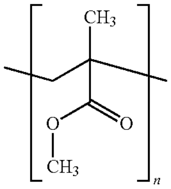

[Chemical Formula 9]

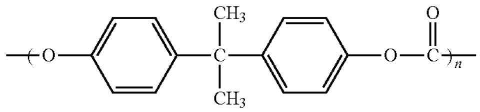

[Chemical Formula 10]

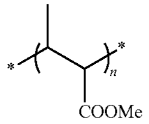

(Me means a methyl group. The asterisk * indicates bonding to a neighboring constituent unit.)

A weight average molecular weight (Mw) of the low solubility component (A) is preferably 150~500,000, more preferably 300~300,000, even more preferably 500~100,000, and yet even more preferably 1,000~50,000.

The low solubility component (A) can be acquired by synthesizing. Or, it can be purchased. In the case of purchasing, for example, the following can be cited as suppliers. It is also possible for a supplier to synthesize the low solubility component (A).

Novolacs: Showa Kasei Co., Ltd., ASAHI YUKIZAI CORPORATION, Gun Ei Chemical Industry Co., Ltd., Sumitomo Bakelite Co., Ltd.

Polyhydroxystyrenes: Nippon Soda Co., Ltd., Maruzen Petrochemical Co., Ltd., TOHO Chemical Industry Co., Ltd.

Polyacrylic acid derivatives: NIPPON SHOKUBAI CO., LTD.

Polycarbonates: Sigma-Aldrich

Polymethacrylic acid derivatives: Sigma-Aldrich

Compared to a total mass of the processing film forming liquid, the low solubility component (A) is of 0.1~50% by mass, preferably 0.5~30% by mass, more preferably 1~20% by mass, and even more preferably 1~10% by mass. That is, on basis of the total mass of the processing film forming liquid being set to 100% by mass, the low solubility component (A) is of 0.1~50% by mass. That is, "compared to" can be reworded as "on basis of." Unless noted otherwise, the same applies hereinafter.

Solubility can be evaluated by a known method. For example, it can be determined according to whether or not the (A) described above or (B) to be described below became dissolved when, under a condition of 20° C.~35° C. (more preferably, 25±2° C.), 100 ppm of (A) or (B) are added to 5.0% by mass ammonia water and, upon placing a lid, shaking with a shaker is performed for 3 hours. Stirring may be performed instead of shaking. Dissolution can also be judged visually. If dissolution did not take place, the solubility is determined as being less than 100 ppm and if dissolution took place, the solubility is determined as being not less than 100 ppm. A solubility of less than 100 ppm is indicated as insoluble or sparingly soluble and a solubility of not less than 100 ppm is indicated as soluble. Broadly speaking, soluble includes slightly soluble. Solubility decreases in the order of: soluble, sparingly soluble, and insoluble. In a narrow sense, slightly soluble is lower in solubility than soluble and higher in solubility than sparingly soluble.

<High Solubility Component>

The high solubility component (B) is a crack promoting component (B'). The crack promoting component (B') contains a hydrocarbon and further contains a hydroxy group (—OH) and/or carbonyl group (—C(═O)—). If the crack promoting component (B') is a polymer, one type of constituent unit contains a hydrocarbon and further has a hydroxy group and/or carbonyl group in each unit. As the carbonyl group, a carboxylic acid (—COOH), aldehyde, ketone, ester, amide, or enone can be cited and a carboxylic acid is preferable.

Although not intended to restrict the scope of rights and not bound by theory, it is believed that when, upon drying of the processing film forming liquid and forming of the processing film, the peeling liquid peels off the processing film, the high solubility component (B) gives rise to portions that start the peeling off of the processing film. It is thus preferable for the high solubility component (B) to be higher in solubility in the peeling liquid than the low solubility component (A). As a mode in which the crack promoting component (B') contains ketone as the carbonyl group, an annular hydrocarbon can be cited. As specific examples, 1,2-cyclohexanedione and 1,3-cyclohexanedione can be cited.

As a more specific mode, the high solubility component (B) is represented by at least one among (B-1), (B-2), and (B-3) indicated below. (B-1) is a compound that contains 1~6 (preferably 1~4) of chemical formula 11 indicated below as a constituent unit and with which each constituent unit is bonded by a linking group (linker $L_1$). Here, the linker $L_1$ may be a single bond or a $C_{1-6}$ alkylene. The $C_{1-6}$ alkylene links the constituent units as a linker and is not restricted to a divalent group. Preferably, it is of a valency of 2~4. The $C_{1-6}$ alkylene may either be a straight chain or be branched.

[Chemical Formula 11]

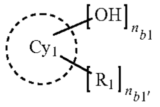

$Cy_1$ is a hydrocarbon ring of $C_{5-30}$ and is preferably phenyl, cyclohexane, or naphthyl and more preferably phenyl. As a preferable mode, the linker $L_1$ has a plurality of $Cy_1$.

$R_1$ is each independently an alkyl of $C_{1-5}$ and is preferably methyl, ethyl, propyl, or butyl. The $C_{1-5}$ alkyl may either be a straight chain or be branched.

$n_{b1}$ is 1, 2, or 3 and is preferably 1 or 2 and more preferably 1. $n_{b1'}$ is 0, 1, 2, 3, or 4 and is preferably 0, 1, or 2.

Chemical formula 12 indicated below is a chemical formula with which the constituent units described by chemical formula 11 are linked using a linker $L_9$. The linker $L_9$ is preferably a single bond, methylene, ethylene, or propylene.

[Chemical Formula 12]

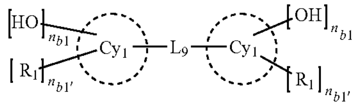

Although not intended to restrict the scope of rights, 2,2-bis(4-hydroxyphenyl)propane, 2,2'-methylenebis(4-methylphenol), 2,6-bis[(2-hydroxy-5-methylphenyl) methyl]-4-methylphenol, 1,3-cyclohexanediol, 4,4'-dihydroxybiphenyl, 2,6-naphthalenediol, 2,5-tert-butylhydroquinone, and 1,1,2,2-tetrakis(4-hydroxyphenyl) ethane can be cited as preferable examples of (B-1). These may be obtained by polymerization or condensation.

As an example, 2,6-bis[(2-hydroxy-5-methylphenyl) methyl]-4-methylphenol represented by chemical formula 13 indicated below shall be taken up and described. This compound has three of the constituent units of chemical formula 11 in (B-1) and the constituent units are bonded by the linker $L_1$ (methylene). $n_{b1}=n_{b1'}=1$ and $R_1$ is methyl.

[Chemical Formula 13]

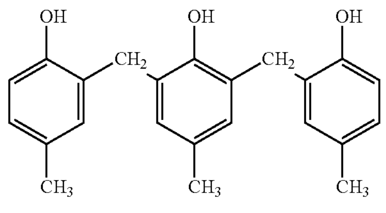

(B-2) is represented by chemical formula 14 indicated below.

[Chemical Formula 14]

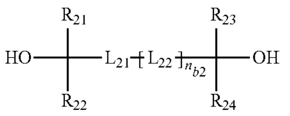

$R_{21}$, $R_{22}$, $R_{23}$, and $R_{24}$ are each independently hydrogen or an alkyl of $C_{1-5}$ and is preferably hydrogen, methyl, ethyl, t-butyl, or isopropyl, more preferably hydrogen, methyl, or ethyl, and even more preferably methyl or ethyl.

A linker $L_{21}$ and a linker $L_{22}$ are each independently an alkylene of $C_{1-20}$, a cycloalkylene of $C_{1-20}$, an alkenylene of $C_{2-4}$, an alkynylene of $C_{2-4}$, or an arylene of $C_{6-20}$. These groups may be substituted with an alkyl of $C_{1-5}$ or hydroxy. Here, alkenylene shall mean a divalent hydrocarbon group having one or more double bonds and alkynylene shall mean a divalent hydrocarbon group having one or more triple bonds. The linker $L_{21}$ and the linker $L_{22}$ are each preferably an alkylene of $C_{2-4}$, acetylene (an alkynylene of $C_2$) or phenylene, more preferably an alkylene of $C_{2-4}$ or acetylene, and even more preferably acetylene.

$n_{b2}$ is 0, 1, or 2 and is preferably 0 or 1 and more preferably 0.

Although not intended to restrict the scope of rights, 3,6-dimethyl-4-octyne-3,6-diol and 2,5-dimethyl-3-hexyne-2,5-diol can be cited as preferable examples of (B-2). As another mode, 3-hexyne-2,5-diol, 1,4-butynediol, 2,4-hexadiyne-1,6-diol, 1,4-butanediol, cis-1,4-dihydroxy-2-butene, and 1,4-benzenedimethanol can also be cited as preferable examples of (B-2).

(B-3) is a polymer that contains constituent units represented by chemical formula 15 indicated below and has a weight average molecular weight (Mw) of 500~10,000. The Mw is preferably 600~5,000 and more preferably 700~3,000.

[Chemical Formula 15]

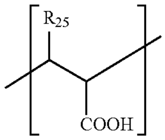

Here, $R_{25}$ is —H, —$CH_3$, or —COOH and is preferably —H or —COOH. It is also allowable for one polymer (B-3) to contain two or more types of constituent units that are each represented by chemical formula 15.

Although not intended to restrict the scope of rights, a polymer of acrylic acid, maleic acid, or a combination of these can be cited as a preferable example of the polymer (B-3). Polyacrylic acid and maleic acid acrylic acid copolymer are even more preferable examples.

In the case of copolymerization, random copolymerization or block copolymerization is preferable and random copolymerization is more preferable.

As an example, a maleic acid acrylic acid copolymer represented by chemical formula 16 indicated below shall be taken up and described. This copolymer has two types of constituent units that are contained in (B-3) and represented by chemical formula 15 with $R_{25}$ in one of the constituent units being —H and $R_{25}$ in the other of the constituent units being —COOH.

[Chemical Formula 16]

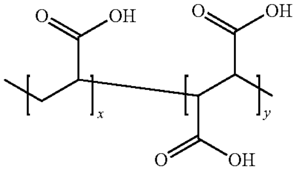

Needless to say, the processing film forming liquid may have one or two or more of the preferable examples described above contained in combination as the high solubility component (B). For example, the high solubility component (B) may contain both 2,2-bis(4-hydroxyphenyl) propane and 3,6-dimethyl-4-octyne-3,6-diol.

The high solubility component (B) may have a molecular weight of 80~10,000. The high solubility component (B) preferably has a molecular weight of 90~5000 and more preferably 100~3000. If the high solubility component (B) is a resin, a polymerized body, or a polymer, the molecular weight is expressed by a weight average molecular weight (Mw).

The high solubility component (B) can be acquired by synthesizing or purchasing. As suppliers, Sigma-Aldrich, Tokyo Chemical Industry, and NIPPON SHOKUBAI can be cited.

In the processing film forming liquid, the high solubility component (B), compared to a mass of the low solubility component (A), is preferably of 1~100% by mass and more preferably of 1~50% by mass. In the processing film forming liquid, the high solubility component (B), compared to the mass of the low solubility component (A), is even more preferably of 1~30% by mass.

<Solvent>

The solvent (C) preferably contains an organic solvent. The solvent (C) may have volatility. To have volatility means that the volatility is high in comparison to water. For example, a boiling point of the solvent (C) at 1 atm is preferably 50~250° C. The boiling point of the solvent at 1 atm is more preferably 50~200° C. and even more preferably 60~170° C. The boiling point of the solvent at 1 atm is yet even more preferably 70~150° C. It is also allowable for the solvent (C) to contain a small amount of pure water. The pure water contained in the solvent (C), compared to the entire solvent (C), is preferably of not more than 30% by mass. The pure water contained in the solvent (C) is more preferably of not more than 20% by mass and even more preferably of not more than 10% by mass. The pure water contained in the solvent (C) is yet even more preferably of not more than 5% by mass. The solvent not containing pure water (0% by mass) is also a preferable mode. The pure water is preferably DIW.

As the organic solvent, an alcohol such as IPA, etc., an ethylene glycol monoalkyl ether such as ethylene glycol monomethyl ether, ethylene glycol monoethyl ether, etc., an ethylene glycol monoalkyl ether acetate such as ethylene glycol monomethyl ether acetate, ethylene glycol monoethyl ether acetate, etc., a propylene glycol monoalkyl ether such as PGME, PGEE, etc., a propylene glycol monoalkyl ether acetate such as PGMEA, propylene glycol monoethyl ether acetate, etc., a lactic acid ester such as methyl lactate, EL, etc., an aromatic hydrocarbon such as toluene, xylene, etc., a ketone such as methyl ethyl ketone, 2-heptanone, cyclohexanone, etc., an amide such as N,N-dimethylacetamide, N-methylpyrrolidone, etc., a lactone such as γ-butyrolactone, etc., and the like can be cited. These organic solvents can be used alone or two or more types can be mixed and used.

As a preferable mode, the organic solvent contained in the solvent (C) is selected from any combination of IPA, PGME, PGEE, EL, and PGMEA. If the organic solvent is a combination of two types, a volume ratio thereof is preferably 20:80~80:20 and more preferably 30:70~70:30.

Compared to the total mass of the processing film forming liquid, the solvent (C) is of 0.1~99.9% by mass. Compared to the total mass of the processing film forming liquid, the solvent (C) is preferably of 50~99.9% by mass and more preferably of 75~99.5% by mass. Compared to the total mass of the processing film forming liquid, the solvent (C) is even more preferably of 80~99% by mass and yet even more preferably of 85~99% by mass.

<Corrosion Inhibiting Component>

As the corrosion inhibiting component (D), other than BTA, uric acid, caffeine, butyrin, adenine, glyoxylic acid, glucose, fructose, mannose, etc., can be cited.

<Other Additive>

The processing film forming liquid of the present invention may further contain another additive (E). As a mode of the present invention, the other additive (E) contains a surfactant, an acid, a base, an antibacterial agent, a bactericide, an antiseptic, or an antifungal agent (preferably a surfactant) and may contain any combination of these.

As a mode of the present invention, the other additive (E) (a sum thereof if there is a plurality), compared to the mass of the low solubility component (A) in the processing film forming liquid, is of 0~100% by mass (preferably of 0~10%, more preferably of 0~5% by mass, even more preferably of 0~3% by mass, and yet even more preferably of 0 to 1% by mass). The processing film forming liquid not containing the other additive (E) is also a mode of the present invention.

Processing Film Peeling Experiment

Next, results of a processing film peeling experiment of using a peeling liquid to peel off a processing film from a major surface of a substrate with a hydrophilic film formed thereon shall be described. FIG. 8 is a table showing the results of the processing film peeling experiment. In the processing film peeling experiment, a plurality of types of substrates W and a plurality of types of hydrophilic films were used to compare peeling performance. Specifically, as the types of substrates, an Si substrate that is hydrophilic and an Si substrate, an a-C substrate, and an SiCN substrate that are hydrophobic were used. As the hydrophilic films, five types of hydrophilic films (samples UL1, UL2, UL3, UL4, and UL5) were used. These samples differ in a length of the main chain. The main chain of the sample UL1 is the longest and the main chain of the sample UL2 is the second longest. The main chain of the sample UL3 is shorter than the main chain of the sample UL2 and shorter than the main chain of the sample UL4. The main chain of the sample UL5 is the shortest.

The processing film peeling experiment was performed according to the following procedure.

(1) First, substrates of small piece form (small substrates) were prepared. Each small substrate is of quadrilateral shape with one side being 3 cm as viewed from a normal direction to a major surface. As the small substrates, small substrates with Si being exposed from a front surface (Si substrates), a small substrate with a-C (amorphous carbon) exposed from a front surface (a-C substrate), and a small substrate with SiCN exposed (SiCN substrate) were used.

(2) Each small substrate was placed on a rotatable mount and while rotating the mount, a hydrophilic film forming liquid was supplied to the front surface of the small substrate to form a hydrophilic film.

(3) DIW was supplied to the front surface of the small substrate to adjust a film thickness of the hydrophilic film.

(4) A processing film forming liquid was supplied to the front surface of the small substrate with the film-thickness-adjusted hydrophilic film formed thereon to form a processing film on the hydrophilic film.

(5) Dilute ammonia water ($dNH_4OH$ 1:68) was supplied to the front surface of the small substrate to peel off the processing film.

(6) Thereafter, the peeling off of the processing film was checked visually and a particle removal efficiency was checked using a scanning electron microscope (SEM).

Next, the results of the processing film peeling experiment shall be described. When any of the samples were used as the hydrophilic film, it was possible to peel off the processing film from the hydrophilic Si substrate by ammonia water. When any of the samples UL1, UL2, and UL3 was used as the hydrophilic film, it was possible to peel off the processing film from the hydrophobic Si substrate by ammonia water. Experiments of using the samples UL4 and UL5 as the hydrophilic films and peeling off the processing film from the hydrophobic Si substrate were not performed.

Although when the sample UL4 was used as the hydrophilic film, the peeling off of the hydrophilic film from the a-C substrate by ammonia water was insufficient, when the samples UL1, UL2, UL3, and UL5 were used as the hydrophilic films, the peeling off of the hydrophilic film from the a-C substrate by ammonia water was sufficient. Although when the sample UL5 was used as the hydrophilic film, the peeling off of the hydrophilic film from the SiCN substrate by ammonia water was insufficient, when the samples UL1, UL2, UL3, and UL4 were used as the hydrophilic films, the peeling off of the hydrophilic film from the SiCN substrate by ammonia water was sufficient.

Particle Removal Experiment

Next, results of the particle removal experiment of measuring the particle removal efficiency when peeling off a processing film from a major surface of a substrate shall be described. FIG. 9 is a table showing the results of the particle removal experiment.

In the particle removal experiment, a plurality of types of hydrophilic films were used to compare particle removal performance. Specifically, as the hydrophilic films, five types of hydrophilic films (samples UL1, UL2, UL3, UL4, and UL5) were used. In the particle removal experiment, a sample ("Without hydrophilic film" of FIG. 9) which a hydrophilic film is not formed on a front surface of a substrate was also used.

The particle removal experiment was performed according to the following procedure.

(1) First, small substrates that are a-C substrates each with particles of $SiO_2$, etc., adhered on a major surface were prepared.

(2) Each small substrate was placed on a rotatable mount and while rotating the mount, a hydrophilic film forming liquid was supplied to a front surface of the small substrate to form a hydrophilic film.

(3) DIW was supplied to the front surface of the small substrate to adjust a film thickness of the hydrophilic film.

(4) A processing film forming liquid was supplied to the front surface of the small substrate with the film-thickness-adjusted hydrophilic film formed thereon to form a processing film on the hydrophilic film.

(5) Dilute ammonia water ($dNH_4OH$ 1:68) was supplied to the front surface of the small substrate to peel off the processing film.

(6) Thereafter, the front surface of the small substrate was rinsed with DIW and further thereafter, IPA was supplied to the front surface of the small substrate to remove residues of the processing film.

(7) After removing the residues of the processing film, the small substrate was rotated at high speed to perform spin drying.

Thereafter, peeling off of the processing film was checked visually and the particle removal efficiency was checked using a scanning electron microscope (SEM).

According to the particle removal experiment, when any of the samples UL1, UL2, UL3, UL4, and UL5 were used as the hydrophilic film, the particle removal efficiency exceeded 80%. On the other hand, when the processing film was peeled off upon forming the processing film on the a-C substrate without forming a hydrophilic film, the particle removal efficiency was 0%. Thus, by forming the hydrophilic film on the front surface of the substrate, it was possible to remove the particles sufficiently from the major surface of the small substrate.

Other Preferred Embodiments

The present invention is not restricted to the preferred embodiments described above and can be implemented in yet other modes.

For example, in the substrate processing described above, the first rinsing step (step S8) and the residue removing liquid supplying step (step S9) can be omitted.

Also, in the substrate processing described above, the rinse liquid used in the first rinsing step (step S8) and the second rinsing step (step S11) and the rinse liquid used in the film thickness reducing step (step S4) are supplied from the same rinse liquid nozzle 11. However, the rinse liquid used in the film thickness reducing step (step S4) may be discharged from a different nozzle than that of the rinse liquid used in the first rinsing step (step S8) and the second rinsing step (step S11) and may differ in liquid type from the rinse liquid used in the first rinsing step (step S8) and the second rinsing step (step S11).

The film thickness reducing step can also be omitted if a sufficiently thin hydrophilic film 100 can be formed in the hydrophilic film forming step.

In the substrate processing described above, the processing position of each nozzle is the central position. However, the processing position is not required to be the central position and may be a position that is shifted from the central position. For example, when the nozzle discharging a liquid is to be switched to another nozzle supported by the same arm, the nozzle discharging a liquid may be switched without moving the position of the arm. More specifically, after the supplying of the hydrophilic film forming liquid from the hydrophilic film forming liquid nozzle 10 is started in the hydrophilic film forming liquid supplying step (step S1), the first arm 35A may be maintained at the same position until the supplying of the rinse liquid from the rinse liquid nozzle 11 in the film thickness reducing step (step S4) is ended. Also, a nozzle is not required to be maintained at a fixed position while discharging a liquid and may discharge the liquid while moving in a horizontal direction along the upper surface of the substrate W.

The substrate W may be heated by the heating member 6 during the forming of the hydrophilic film 100. By heating the hydrophilic film forming liquid via the substrate W, the evaporation of the solvent from the hydrophilic film forming liquid can be promoted further. The means for heating the substrate W is not restricted to heating by a heater and the substrate W may be heated by supplying hot water or other heating fluid toward the lower surface of the substrate W. Also, the heating of the hydrophilic film forming liquid does not need to be performed via the substrate W and the hydrophilic film forming liquid may instead be heated directly by a lamp, etc., disposed further upward than the substrate W. Similarly, the substrate W may be heated during the forming of the processing film 101.

The substrate processing described above is performed using the substrate W with which the major surface is a hydrophobic surface. However, the substrate processing described above can also be performed on a substrate W with which the major surface is not a hydrophobic surface. Also, although with the substrate processing described above, the forming and removal of the hydrophilic film 100 and the forming and removal of the processing film 101 are performed on the upper surface of the substrate W, these processings may obviously be performed on the lower surface (major surface at the lower side) of the substrate W instead.

Also, with the preferred embodiments described above, the plurality of processing units 2 are included, together with the transfer robots IR and CR and the controller 3, in the substrate processing apparatus 1. However, a substrate processing apparatus may be arranged from just a single processing unit 2 instead. In other words, the processing unit 2 may be an example of a substrate processing apparatus.

Also, unlike in the preferred embodiments described above, DIW or other rinse liquid may be supplied to the upper surface of the substrate W to form a film of the rinse liquid in a puddle state (DIW puddle step, rinse liquid puddle step) before the hydrophilic film forming liquid supplying step (step S2). If the same liquid as the solvent of the hydrophilic film forming liquid (for example, DIW) is used as the rinse liquid, the hydrophilic film forming liquid will spread on the upper surface of the substrate W while becoming mixed with the rinse liquid on the upper surface of the substrate W and therefore, the hydrophilic film forming liquid can be made to spread quickly across the entirety of the upper surface of the substrate W.

Also, although expressions such as "along," "horizontal," and "vertical" are used for the preferred embodiments described above, it is not required that "along," "horizontal," and "vertical" apply strictly. That is, the respective expressions allow deviations in manufacturing precision, installation precision, etc.

In the present Description, when a numerical range is indicated using "~" or "-," unless restrictedly mentioned otherwise, both endpoints are included and the units are the same.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

The present application corresponds to Japanese Patent Application No. 2021-039289 filed on Mar. 11, 2021 in the Japan Patent Office, and the entire disclosure of this application is incorporated herein by reference.

REFERENCE SIGNS LIST

1: substrate processing apparatus
2: processing unit (substrate processing apparatus)
10: hydrophilic film forming liquid nozzle (hydrophilic film forming liquid supplying member)

11: rinse liquid nozzle (film thickness reducing liquid supplying member)
13: processing film forming liquid nozzle (processing film forming liquid supplying member)
14: peeling liquid nozzle (peeling liquid supplying member)
100: hydrophilic film
101: processing film
103: removal object
110: high solubility solid (high solubility component)
111: low solubility solid (low solubility component, hydrophobic component)
200: hydrophilic component
202: hydrophobic side chain (hydrophobic group)
203: hydrophilic side chain (hydrophilic group)
210: high solubility component
211: low solubility component (hydrophobic component)
T1: thickness
T2: thickness
W: substrate

The invention claimed is:

1. A substrate processing method comprising:
supplying, toward a first surface of a substrate on which a removal object having a particle diameter is present, a hydrophobic film forming liquid to form a hydrophilic film having a thickness of a first value greater than the particle diameter of the removal object on the first surface of the substrate;
supplying, toward the first surface of the substrate, a film thickness reducing liquid that dissolves a portion of the hydrophilic film to reduce the thickness of the hydrophilic film from the first value to a second value smaller than the particle diameter of the removal object;
supplying, toward the first surface of the substrate after the thickness of the hydrophilic film has been reduced to the second value by the film thickness reducing liquid, a processing film forming liquid to form, on a front surface of the hydrophilic film, a processing film that holds the removal object present on the first surface of the substrate; and
supplying, toward the first surface of the substrate, a peeling liquid to peel off the processing film from the hydrophilic film.

2. The substrate processing method according to claim 1, further comprising: supplying, toward the first surface of the substrate after the peeling liquid supplying, a hydrophilic film removing liquid to remove the hydrophilic film from the first surface of the substrate.

3. The substrate processing method according to claim 2, wherein the hydrophilic film removing liquid is an acidic liquid.

4. The substrate processing method according to claim 1, wherein the hydrophilic film forming liquid contains a hydrophilic component having hydrophobic groups and hydrophilic groups and having more hydrophilic groups than hydrophobic groups.

5. The substrate processing method according to claim 1, wherein the processing film forming liquid contains a first component and a second component that is less soluble in the peeling liquid than the first component.

6. The substrate processing method according to claim 1, wherein the peeling liquid is an alkaline liquid.

7. The substrate processing method according to claim 1, wherein the first surface of the substrate is a hydrophobic surface.

8. The substrate processing method according to claim 7, wherein the hydrophobic surface is a surface on which at least one selected from the group consisting of amorphous carbon, silicon carbide, and ruthenium is exposed.

9. The substrate processing method according to claim 1, wherein the film thickness reducing liquid is water.

10. A substrate processing apparatus comprising:
a hydrophilic film forming liquid nozzle that supplies, toward a first surface of a substrate, a hydrophilic film forming liquid to form a hydrophilic film;
a film thickness reducing liquid nozzle that supplies, toward the first surface of the substrate, a film thickness reducing liquid that dissolves the hydrophilic film to reduce a thickness of the hydrophilic film;
a processing film forming liquid nozzle that supplies, toward the first surface of the substrate, a processing film forming liquid to form a processing film;
a peeling liquid nozzle that supplies, toward the first surface of the substrate, a peeling liquid to peel off the processing film from the hydrophilic film; and
a controller configured or programmed to control the substrate processing apparatus to perform operations comprising:
supplying, via the hydrophilic film forming liquid nozzle, the hydrophilic film forming liquid towards the first surface of the substrate, wherein the first surface comprises a removal object having a particle diameter, wherein the hydrophilic film forming liquid forms the hydrophilic film on the first surface, and wherein the hydrophilic film has a thickness of a first value greater than the particle diameter of the removal object;
supplying, via the film thickness reducing liquid nozzle, the film thickness reducing liquid towards the first surface of substrate, wherein the film thickness reducing liquid dissolves a portion of the hydrophilic film to reduce the thickness of the hydrophilic film from the first value to a second value smaller than the particle diameter of the removal object;
supplying, via the processing film forming liquid nozzle and after the thickness of the hydrophilic film has been reduced to the second value, the processing film forming liquid to form, on a front surface of the hydrophilic film, the processing film such that the processing film holds the removal object; and
supplying, via the peeling liquid nozzle, the peeling liquid toward the first surface of the substrate to peel off the processing film from the hydrophilic film.

11. The substrate processing method according to claim 1, wherein
the first value is not less than 20 nm and not more than 30 nm, and
the second value is not less than 1 Å and not more than 10 Å.

* * * * *